United States Patent
Park et al.

(10) Patent No.: US 10,292,317 B2
(45) Date of Patent: May 14, 2019

(54) ELECTROMAGNETIC SHIELD STRUCTURE FOR ELECTRONIC DEVICE

(71) Applicant: Samsung Electronics Co., Ltd., Gyeonggi-do (KR)

(72) Inventors: Jung-Sik Park, Gyeonggi-do (KR); Seung-Ki Choi, Gyeonggi-do (KR); Joon Heo, Gyeonggi-do (KR); Hyun-Ju Hong, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/943,338

(22) Filed: Apr. 2, 2018

(65) Prior Publication Data
US 2018/0228061 A1    Aug. 9, 2018

Related U.S. Application Data

(63) Continuation of application No. 15/045,841, filed on Feb. 17, 2016, now Pat. No. 9,943,018.

(30) Foreign Application Priority Data

Feb. 17, 2015    (KR) .................. 10-2015-0024499

(51) Int. Cl.
*H05K 1/02*    (2006.01)
*H05K 9/00*    (2006.01)
*H05K 5/00*    (2006.01)

(52) U.S. Cl.
CPC ........... *H05K 9/002* (2013.01); *H05K 1/0218* (2013.01); *H05K 5/0004* (2013.01);
(Continued)

(58) Field of Classification Search
None
See application file for complete search history.

(56) References Cited

U.S. PATENT DOCUMENTS 5,844,784 A * 12/1998 Moran ................. H05K 9/0032
361/818
6,178,097 B1 * 1/2001 Hauk, Jr. .............. H05K 9/0026
174/378

(Continued)

FOREIGN PATENT DOCUMENTS

DE    2 216 333    10/1973
EP    1 130 953    9/2001

OTHER PUBLICATIONS

European Search Report dated Jul. 26, 2016 issued in counterpart application No. 16156104.8-1803, 7 pages.
(Continued)

*Primary Examiner* — Xanthia C Cunningham
(74) *Attorney, Agent, or Firm* — The Farrell Law Firm, P.C.

(57) ABSTRACT

An electronic device is provided that includes a PCB including a first surface, a second surface, and a side surface; an electronic component arranged on the first surface, adjacent to a portion of the side surface; a shield structure including a cap that covers the electronic component and a sidewall extending from a periphery of the cap toward the first surface of the PCB, wherein the sidewall extends in a first direction that is non-parallel to the first surface of the PCB; a first conductive structure that is formed on a portion of the side surface of the PCB; and a second conductive structure that is formed on a portion of the first surface to be connected to the first conductive structure. The sidewall contacts with the first surface of the PCB and overlaps with the second conductive structure, when viewed from above the first surface of the PCB.

20 Claims, 58 Drawing Sheets

(52) U.S. Cl.
CPC ......... *H05K 5/0017* (2013.01); *H05K 9/0024* (2013.01); *H05K 9/0039* (2013.01); *H01L 2224/16225* (2013.01); *H05K 1/0259* (2013.01); *H05K 2201/0919* (2013.01); *H05K 2201/09354* (2013.01); *H05K 2201/10371* (2013.01)

(56) References Cited

U.S. PATENT DOCUMENTS

| | | | | |
|---|---|---|---|---|
| 6,930,891 B1* | 8/2005 | Hama | ................. | H05K 9/0026 174/359 |
| 8,848,395 B2* | 9/2014 | Qin | ................. | H05K 7/12 361/764 |
| 9,215,833 B2* | 12/2015 | Dolci | ................. | H05K 9/0049 |
| 2002/0185294 A1* | 12/2002 | Shlyakhtichman | .. | H05K 9/0032 174/384 |
| 2004/0080044 A1* | 4/2004 | Moriyama | ............. | H01L 23/10 257/728 |
| 2007/0181996 A1 | 8/2007 | Chang et al. | | |
| 2007/0235221 A1* | 10/2007 | Chang | ................. | H05K 9/0032 174/382 |
| 2009/0159329 A1* | 6/2009 | Krohn | ................. | H05K 9/0033 174/377 |
| 2009/0181563 A1* | 7/2009 | Lin | ................. | H01R 12/58 439/92 |
| 2009/0266603 A1* | 10/2009 | Kao | ................. | H05K 9/0015 174/377 |
| 2009/0273912 A1* | 11/2009 | Myers | ................. | H05K 9/0032 361/818 |
| 2009/0308653 A1* | 12/2009 | Wu | ................. | H01Q 1/526 174/377 |
| 2010/0084180 A1* | 4/2010 | Chiang | ................ | H05K 9/0032 174/377 |
| 2010/0085719 A1* | 4/2010 | Lu | ................. | H05K 5/0091 361/782 |
| 2010/0246143 A1 | 9/2010 | Dinh et al. | | |
| 2011/0013368 A1* | 1/2011 | Nagaike | ................. | H05K 3/284 361/728 |
| 2011/0090664 A1* | 4/2011 | Sumida | ................. | H05K 1/111 361/818 |
| 2011/0094791 A1* | 4/2011 | Kim | ................. | H05K 9/0022 174/377 |
| 2011/0304993 A1* | 12/2011 | Takemura | ............ | H01L 23/3121 361/736 |
| 2012/0104570 A1* | 5/2012 | Kim | ................. | H01L 23/552 257/659 |
| 2012/0113601 A1* | 5/2012 | Kohara | ................ | H05K 9/0032 361/736 |
| 2013/0089992 A1* | 4/2013 | Yang | ................. | H05K 1/144 439/75 |
| 2014/0264788 A1* | 9/2014 | Masuda | ............ | H01L 23/49833 257/664 |
| 2015/0029682 A1* | 1/2015 | Kadoya | ................ | H05K 9/0039 361/748 |
| 2015/0181773 A1* | 6/2015 | Ueda | ................... | H05K 9/0028 361/818 |
| 2017/0025319 A1* | 1/2017 | Partington | ............. | H01L 23/42 |

OTHER PUBLICATIONS

European Search Report dated Sep. 5, 2018 issued in counterpart application No. 16156104.8-1204, 5 pages.

* cited by examiner (a)

(b)

ELECTROMAGNETIC SHIELD STRUCTURE FOR ELECTRONIC DEVICE

PRIORITY

This application is a Continuation application of, and claims priority under 35 U.S.C. § 120 to, U.S. patent application Ser. No. 15/045,841, which was filed on Feb. 17, 2016, issued on Apr. 10, 2018 as U.S. Pat. No. 9,943,018, and claimed priority under 35 U.S.C. § 119(a) to Korean Application Serial No. 10-2015-0024499, which was filed in the Korean Intellectual Property Office on Feb. 17, 2015, the entire contents of all of which are incorporated herein by reference.

BACKGROUND

1. Field of the Invention

The present disclosure relates generally to an electromagnetic structure for an electronic device.

2. Description of the Related Art

Electronic devices include various pieces of hardware that are integrated on a Printed Circuit Board (PCB) in order to support various functions. For example, a terminal, which supports a mobile communication function, includes a communication chip for supporting the mobile communication function and a processor chip for supporting a multimedia function, both of which are integrated on a PCB. In addition, a processor chip for supporting a touch screen, and various modules for supporting user functions, such as a broadcasting reception module for a broadcasting reception function and a short-range wireless communication module for supporting a short-range wireless communication function, may also be integrated on the PCB.

The PCB, which is mounted in the electronic devices, may be regarded as a type of an electronic component device that includes wiring and mounting spaces for mounting a plurality of electronic components thereon. Recently, such a PCB has been implemented as a multi-layer structure.

Surface Mount Technology (SMT) is a technology for mounting a surface-mounted component on such a PCB and soldering the component to the PCB. In particular, among the devices related to the SMT, a reflow soldering machine makes a PCB, which is printed with solder and is mounted with a plurality of chip components. The PCB is then passed through a furnace having a preset high temperature so that the solder is molten and then solidified, thereby causing the chip components to be bonded to the PCB. The electronic components that are mounted on the PCB through a reflow soldering process as described above are commonly referred to as "Surface Mounting Devices (SMD)".

In addition, when a plurality of chips and components are mounted on a PCB, hardware for supporting respective functions may generate noise while performing a switching operation for data processing. The generated noise acts as noise to other processor chips thereraround.

To address this noise issue, predetermined chips and components are mounted using a shield unit in order to spatially isolate the predetermined chips and components from an external electromagnetic signal. Using the shield unit, an electric interference signal and a signal radiated to a space are blocked.

However, as the electronic devices, which support the communication function, are slimmed, the bezels of the electronic devices are minimized, and as other additional pieces of hardware are mounted, it becomes difficult to secure a space, such as a component mounting space or a wiring space, and there is a limit in space allocation.

The space allocation puts a lot of pressure either from a design standpoint of electronic devices or a technology standpoint of electronic devices.

SUMMARY

Accordingly, an aspect of the present disclosure is to provide an electromagnetic shield structure for an electronic device, which is capable of securing a space for mounting a component or wiring within a limited PCB space.

Another aspect of the present disclosure is to provide an electromagnetic shield structure for an electronic device, which is capable of securing a performance of suppressing ElectroStatic Discharge (ESD)/ElectroMagnetic Interference (EMI) while enhancing component mounting and wiring efficiency within a limited PCB space.

In accordance with an aspect of the present disclosure, an electronic device is provided, which includes a printed circuit board (PCB) including a first surface, a second surface, and a side surface; an electronic component arranged on the first surface, adjacent to a portion of the side surface; a shield structure including a cap that covers the electronic component and a sidewall extending from a periphery of the cap toward the first surface of the PCB, wherein the sidewall extends in a first direction that is non-parallel to the first surface of the PCB; a first conductive structure that is formed on a portion of the side surface of the PCB; and a second conductive structure that is formed on a portion of the first surface to be connected to the first conductive structure. The sidewall contacts with the first surface of the PCB and overlaps with the second conductive structure, when viewed from above the first surface of the PCB.

BRIEF DESCRIPTION OF THE DRAWINGS

The above and other aspects, features, and advantages of certain embodiments of the present disclosure will be more apparent from the following detailed description taken in conjunction with the accompanying drawings, in which.

DETAILED DESCRIPTION

Figure 1:
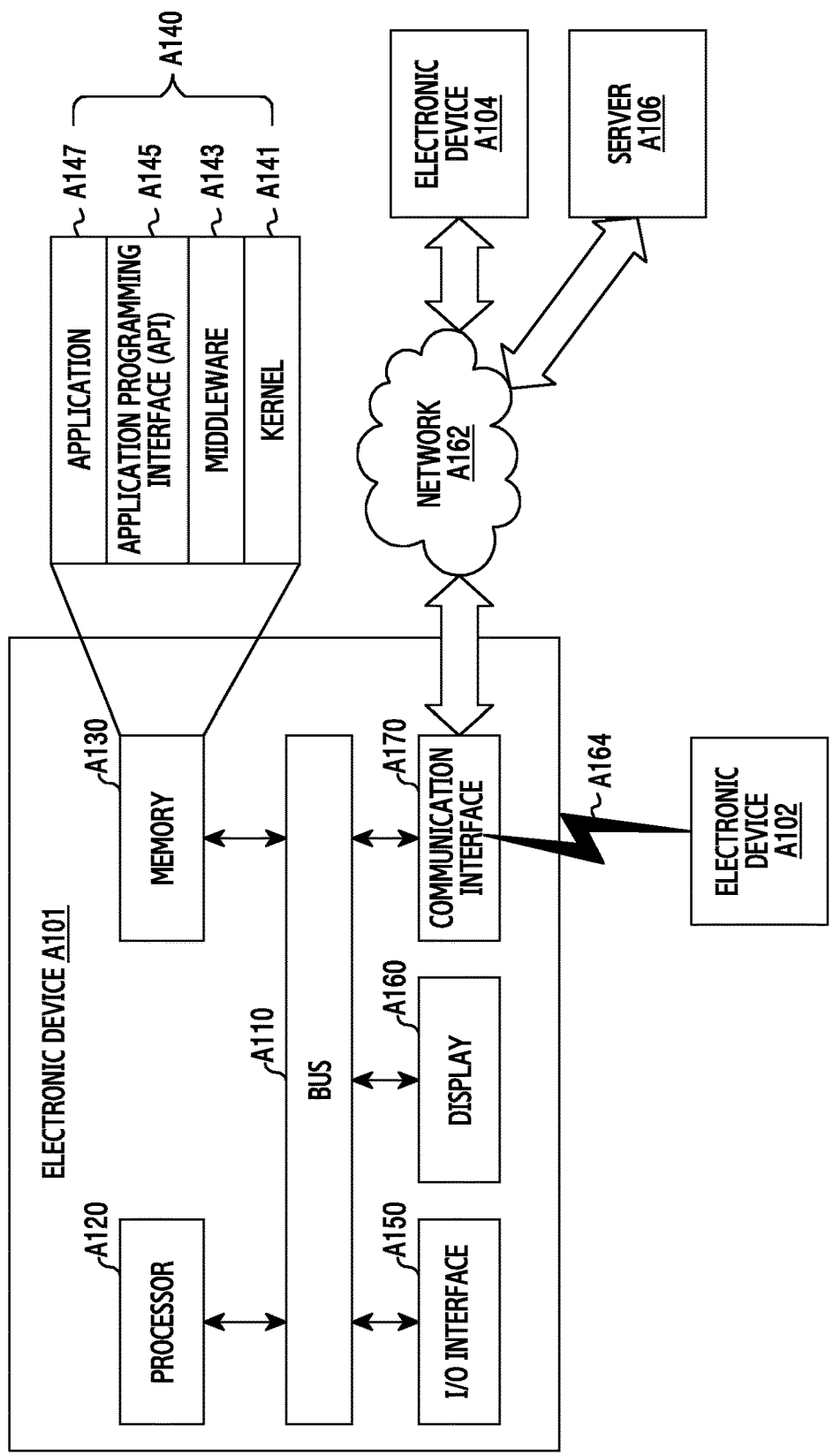
FIG. 1 illustrates a network environment including an electronic device according to an embodiment of the present disclosure.

Hereinafter, various embodiments of the present disclosure will be described with reference to the accompanying drawings. Although specific embodiments of the present disclosure are illustrated in the drawings and relevant detailed descriptions are provided, various changes can be made and various embodiments may be provided. Accordingly, various embodiments of the present disclosure are not limited to the specific embodiments and should be construed as including all changes and/or equivalents or substitutes included in the ideas and technological scopes of embodiments of the present disclosure.

In the explanation of the drawings, similar reference numerals are used for similar elements.

Herein, the terms "include" or "may include" may indicate the presence of disclosed corresponding functions, operations, elements, etc., but do not limit the presence of additional one or more functions, operations, elements, etc. In addition, the terms "include" or "have" indicate the presence of features, numbers, steps, operations, elements, parts, or a combination thereof described in the specifications, but do not preclude the presence or addition of one or more other features, numbers, steps, operations, elements, parts, or a combination thereof.

The term "or" includes any and all combinations of words enumerated with it. For example, "A or B" means A, B, or both A and B.

Although the terms such as "first" and "second" may modify various elements of the various embodiments, these terms do not limit the corresponding elements. For example, these terms do not limit an order and/or importance of the corresponding elements. These terms may be used to distinguish one element from another element. For example, a first electronic device and a second electronic device indicate electronic devices and may indicate different electronic devices. For example, a first element may be referred to as a second element without departing from the scope of right of the various embodiments of the present invention, and similarly, a second element may be referred to as a first element.

When an element is described as being "connected" or "coupled" to another element, the element may be directly connected or coupled to another element, or there may be an intervening element between the element and another element. However, when an element is mentioned as being "directly connected" or "directly coupled" to another element, there is no intervening element between the element and another element.

The various terms used herein are for the purpose of describing specific embodiments only and are not intended to limit various embodiments of the present disclosure.

Herein, singular forms are intended to include the plural forms as well, unless the context clearly indicates otherwise.

All of the terms used herein, including technical or scientific terms, have the same meanings as those generally understood by an ordinary skilled person in the related art, unless they are defined otherwise. The terms defined in a generally used dictionary should be interpreted as having the same meanings as the contextual meanings of the relevant technology and should not be interpreted as having ideal or exaggerated meanings, unless they are clearly defined as such in the various embodiments.

An electronic device according to an embodiment of the present disclosure may be equipped with a communication function. For example, the electronic device may include a smartphone, a tablet personal computer (PC), a mobile phone, a video phone, an electronic book reader, a desktop PC, a laptop PC, a netbook computer, a Personal Digital Assistant (PDA), a Portable Multimedia Player (PMP), an MP3 player, a mobile medical machine, a camera, or a wearable device (for example, a head-mounted-device (HMD) such as electronic glasses, electronic clothing, an electronic bracelet, an electronic necklace, an electronic appcessory, electronic tattoos, or a smart watch).

In addition, the electronic device may be a flexible device.

The electronic device may also be a combination of one or more of the above-described devices.

In addition, it is obvious to a person having ordinary skill in the art that an electronic device according to an embodiment of the present disclosure is not limited to the above-described devices.

Herein, the term "user" may refer to a person who uses the electronic device or a device (for example, an artificial intelligence electronic device) that uses the electronic device.

FIG. 1 illustrates a network environment including an electronic device according to an embodiment of the present disclosure.

Referring to FIG. 1, the electronic device A101 includes a bus A110, a processor A120, a memory A130, an input and output (I/O) interface A140, a display A150, and a communication interface A160.

The bus A110 may be a circuit which connects the above-described elements with one another and transmits communication (for example, a control message) between the above-described elements.

The processor A120 may receive instructions from the other elements (for example, the memory A130, the input and output interface A140, the display A150, the communication interface A160, etc.) via the bus A110, decipher the instructions, and perform calculation or data processing according to the deciphered instructions.

The memory A130 may store instructions or data which is received from or generated by the processor A120 or the other elements (for example, the input and output interface A140, the display A150, the communication interface A160, etc.). The memory A130 also includes a plurality of programming modules, i.e., a kernel A131, middleware A132, an Application Programming Interface (API) A133, and an application A134. Each of the above-described programming modules may be configured by software, firmware, hardware, or a combination of two or more of them.

The kernel A131 may control or manage system resources (for example, the bus A110, the processor A120, the memory A130, etc.) that are used for performing operations or functions implemented in the other programming modules, for example, the middleware A132, the API A133, or the application A134. In addition, the kernel A131 may provide an interface for allowing the middleware A132, the API A133, or the application A134 to access an individual element of the electronic device and control or manage the element.

The middleware A132 may serve as an intermediary for the API A133 or the application A134 to communicate with the kernel A131 and exchange data with the kernel A131. In addition, the middleware A132 may perform controlling (for example, scheduling or load balancing) with respect to work requests received from the application A134, for example, by giving priority to use the system resources of the electronic device (for example, the bus A110, the processor A120, the memory A130, etc.) to at least one application.

The API A133 may be an interface for allowing the application A134 to control a function provided by the kernel A131 or the middleware A132, and may include at least one interface or function (e.g., instructions) for controlling a file, controlling a window, processing an image, or controlling a text.

The application A134 may include a Short Message Service (SMS)/Multimedia Messaging Service (MMS) application, an email application, a calendar application, a notification application, a health care application (e.g., an application for measuring exercise or a blood sugar level), an environment information application (e.g., an application for providing information on atmospheric pressure, humidity, or temperature), etc. Additionally or alternatively, the application A134 may be an application related to information exchange between the electronic device and an external electronic device (e.g., an electronic device A104). The application related to the information exchange may include a notification relay application for relaying specific information to an external electronic device or a device management application for managing an external electronic device.

The notification relay application may include a function of relaying notification information generated by other applications of the electronic device (e.g., the SMS/MMS application, the email application, the health care application, the environment information application, etc.) to an external electronic device A104. Additionally or alternatively, the notification relay application may receive notification information from an external electronic device A104 and may provide the same to the user. The device management application may manage (e.g., install, delete or update) a function regarding at least part of an external electronic device A104 communicating with the electronic device (e.g., turning on/off the external electronic device (or some parts) or adjusting brightness (or resolution) of a display), an application operating in the external electronic device or a service provided by the external electronic device (e.g., a calling service or a message service).

The application A134 may include an application which is specified according to the attribute (e.g., a kind of an electronic device) of an external electronic device A104.

When the external electronic device is an MP3 player, the application A134 may include an application related to music replay. Similarly, when the external electronic device is a mobile medical device, the application A134 may include an application related to health care. The application A134 may include at least one of an application specified by the electronic device or an application received from an external electronic device (e.g., a server A106 or the electronic device A104).

The input and output interface A140 may transmit instructions or data inputted by a user through an input and output device (e.g., a sensor, a keyboard or a touch screen) to the processor A120, the memory A130, or the communication interface A160 through the bus A110, for example. The input and output interface A140 may provide data on a user touch input through a touch screen to the processor A120. In addition, the input and output interface A140 may output instructions or data received from the processor A120, the memory A130, or the communication interface A160 through the bus A110 through the input and output device (e.g., a speaker or a display). The input and output interface A140 may output voice data processed through the processor A120 to the user through a speaker.

The display A150 may display a variety of information (e.g., multimedia data, text data, etc.) for the user.

The communication interface A160 may connect communication between the electronic device and the electronic device A104 or the server A106. The communication interface A160 may be connected to a network A162 via wireless communication or wire communication to communicate with the external device. The wireless communication may include at least one of Wireless Fidelity (WiFi), Bluetooth (BT), Near Field Communication (NFC), a Global Positioning System (GPS), or cellular communication (e.g., Long Term Evolution (LTE), LTE-Advance (LTE-A), code division multiple access (CDMA), wideband CDMA (WCDMA), Universal Mobile Telecommunications System (UMTS), Wireless Broadband (WiBro), Global System for Mobile Communications (GSM), etc.). The wire communication may include at least one of a Universal Serial Bus (USB), a High Definition Multimedia Interface (HDMI), a Recommended Standard 232 (RS-232), or plain old telephone service (POTS).

The network A162 may be a telecommunications network. The telecommunications network may include at least one of a computer network, Internet, Internet of Things (IoT), or a telephone network. A protocol for communicating between the electronic device A101 and the external device (e.g., a transport layer protocol, a data link layer protocol, or a physical layer protocol) may be supported in at least one of the application A134, the application programming interface A133, the middleware A132, the kernel A131, or the communication interface A160.

Figure 2:
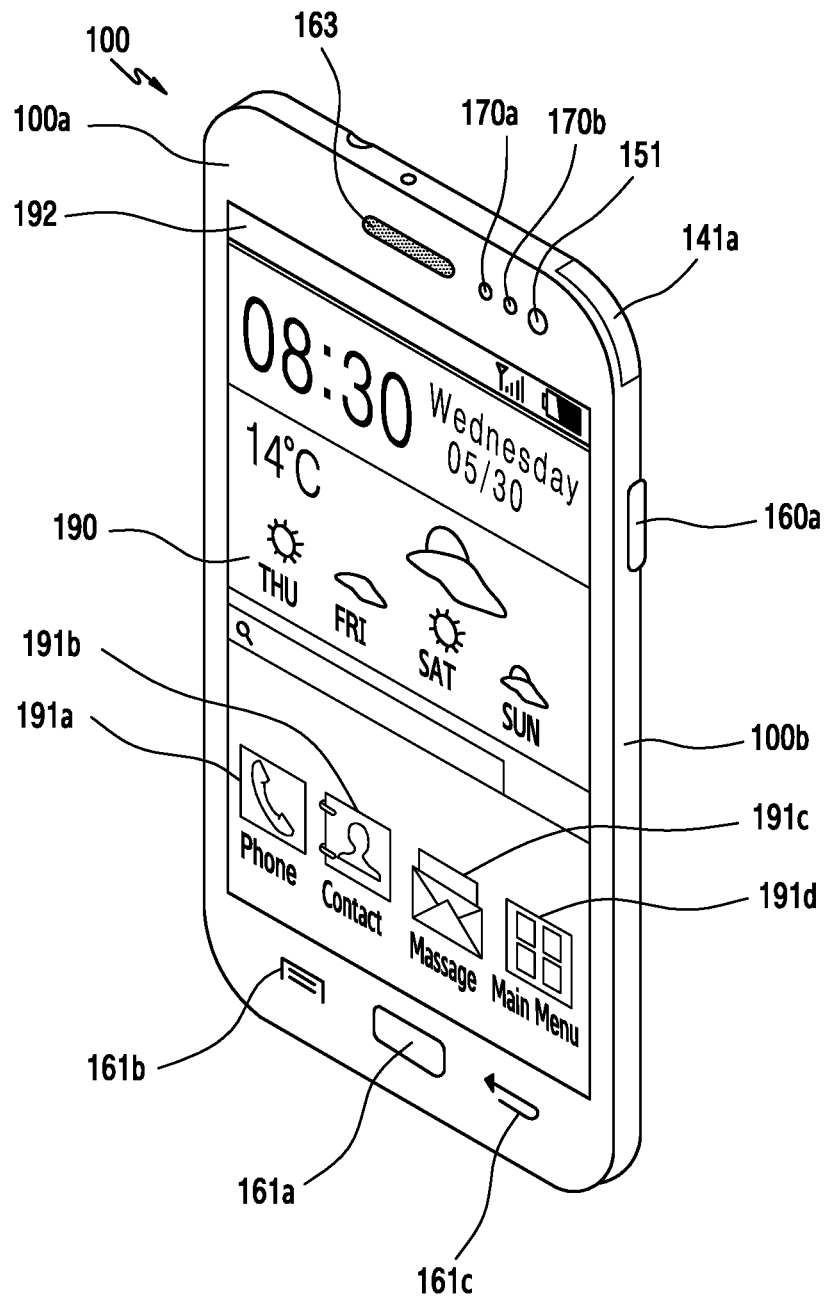
FIG. 2 illustrates a front side view of an electronic device according to an embodiment of the present disclosure.
Figure 3:
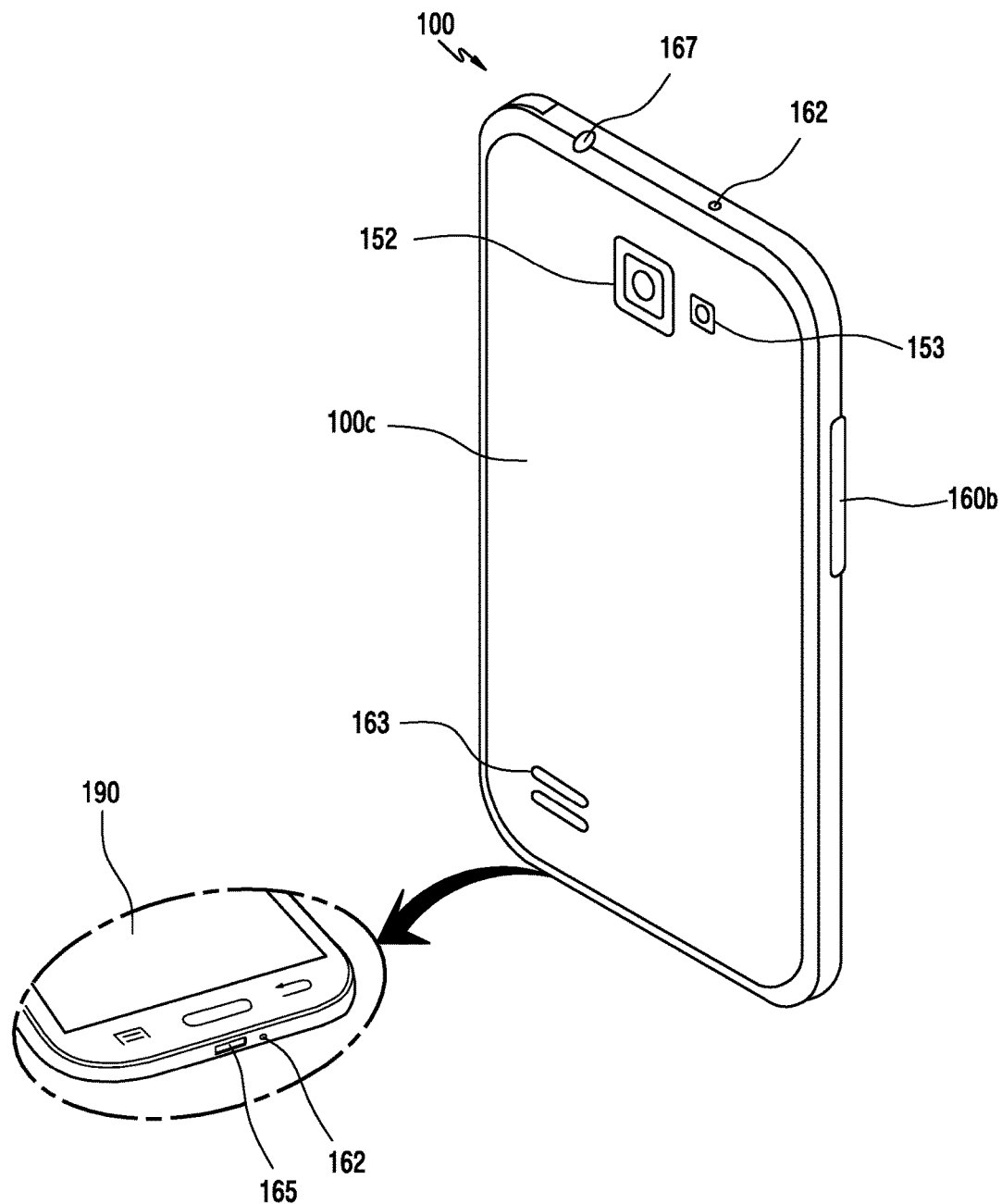
FIG. 3 illustrates a rear side view of an electronic device of an embodiment of the present disclosure.

FIG. 2 illustrates a front side of an electronic device according to an embodiment of the present disclosure. FIG. 3 illustrates a rear side of an electronic device according to an embodiment of the present disclosure.

Referring to FIGS. 2 and 3, a touch screen 190 is centrally arranged on a front face 100a of an electronic device 100. The touch screen 190 is formed in a large size to occupy a large portion of the front face 100a of the electronic device 100. FIG. 2 illustrates an example in which a main home screen is displayed on the touch screen 190. The main home screen refers to the first screen that is displayed on the touch screen 190 when the power of the electronic device 100 is turned on. In addition, when the electronic device 100 has several pages of different home screens, the main home screen may be the first home screen among the several pages of different home screens. The home screen may display shortcut icons 191a, 191b, and 191c to execute frequently used applications, a main menu switching key 191d, time, weather, etc. The main menu switching key 191d may cause the main screen to be displayed on the touch screen 190. In addition, in the upper end of the touch screen 190, status bars 192 may be formed to indicate the statuses of the electronic device 100, such as a battery charge status, a received signal strength, and the current time.

Below the touch screen 190, a home button 161a, a menu button 161b, and a back button 161c are formed.

The home button 161a causes the main home screen to be displayed on the touch screen 190. For example, when the home button 161a is touched, the main home screen is displayed on the touch screen 190. In addition, the home button 161a may be used in order to cause the touch screen 190 to display the most recently used application or a task manager.

The menu button 161b provides a connection menu that may be used on the touch screen 190. The connection menu may include a widget addition menu, a background screen change menu, a retrieve menu, an edition menu, an environment setting menu, etc. The back button 161c may cause the screen, which was executed just prior to the currently executed screen, to be displayed, or may cause the most recently used application to be terminated.

A first camera 151, an illuminance sensor 170a, a proximity sensor 170b, and a speaker 163 are arranged in an edge of the front face 100a of the electronic device 100. A second camera 152 and a flash 153 are arranged on the rear face 100c of the electronic device 100.

A power/reset button 160a, a volume button 160b, a terrestrial DMB antenna 141a for broadcasting reception, one or more mics 162, etc., are arranged on the side faces 100b of the electronic device 100. The DMB antenna 141a may be fixed to the electronic device 100, or may be formed to be removable from the electronic device 100.

In addition, a connector 165 is formed on the lower end side face of the electronic device 100. The connector 165 is formed with a plurality of electrodes, and may be connected to an external device via a wire. An earphone connecting jack 167 is arranged on the upper end side face of the electronic device 100. An earphone may be inserted into the earphone connecting jack 167. Alternatively, the earphone connecting jack 167 may be arranged on the lower end side face of the electronic device 100.

In a three-dimensional X/Y/Z orthogonal coordinate system indicated in each of the drawings to be referred herein, a "Z-axis" indicates a vertical direction that corresponds to the thickness direction of a PCB, an "X-axis" indicates a first horizontal direction that corresponds to the width direction of the PCB, and a "Y-axis" indicates a second horizontal direction that is perpendicular to the first horizontal direction and corresponds to the length direction of the PCB.

Figure 4:
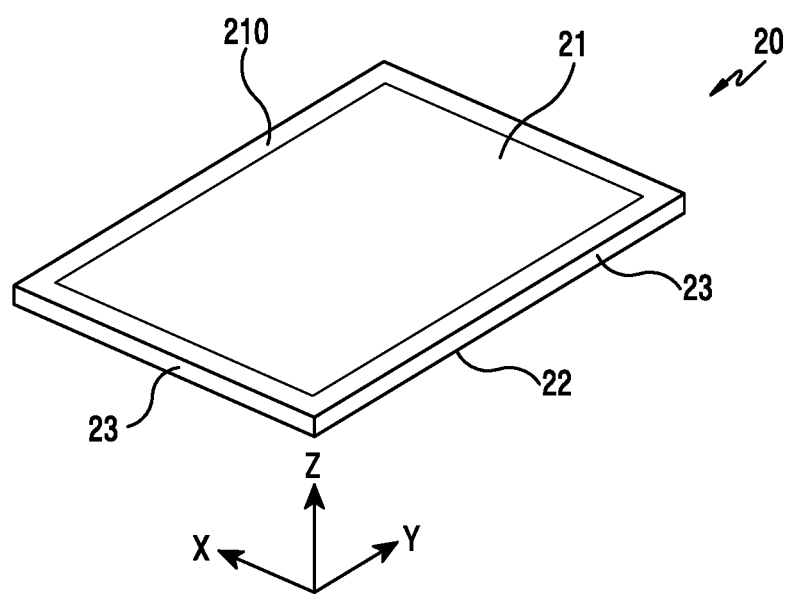
FIG. 4 illustrates a PCB according to an embodiment of the present disclosure.

FIG. 4 illustrates a PCB according to an embodiment of the present disclosure.

Referring to FIG. 4, a PCB 20, which may be mounted in an electronic device, may be regarded as a kind of an electronic component device, on which a wiring and mounting spaces for mounting a plurality of electronic components, are printed. The PCB 20 may be implemented in a multilayer structure.

The PCB 20, which may be used as a central component of numerous electronic devices, includes a conductive pattern that is fixedly formed of a conductive material on a surface and/or within the inside of an electrically insulative substrate based on an electric design. The PCB 20 may serve as an abutment, on which various internal components of a final completed product are mounted, and may function to interconnect signals of the components.

An electronic device may include at least one PCB 20 embedded therein, and a plurality of chips or components, which support a number of functions, may be mounted on the PCB 20. Each of the plurality of components may be mounted on the top surface 21, the bottom surface 22, or a side surface 23 of the PCB 20. Surface-mounted components may be mounted on the top surface 21 and/or the bottom surface 22 of the PCB using a surface mounting process. The PCB 20 may be configured as a rigid PCB or a flexible PCB. In addition, the PCB 20 may be mounted within the electronic device as a joint structure in which several rigid PCBs are interconnected by one or more flexible PCBs. The PCB may be fabricated by shielding (e.g., plating) the outer periphery 210 with a conductive material in order to block noise that is generated within the PCB.

Hereinafter, descriptions will be made, by way of an example, of a mounting structure for mounting a shield unit, which is used for blocking electromagnetic waves, on a PCB, among the plurality of components that are mounted on the PCB 20.

Figure 5A:
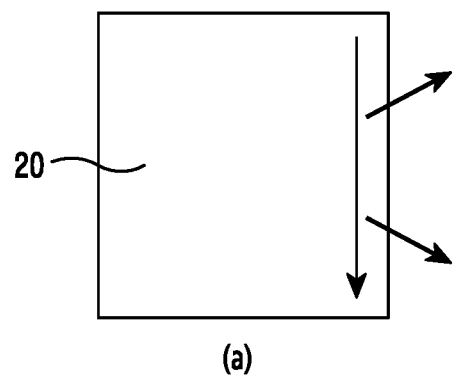
FIG. 5A illustrates a shield structure of noise that is generated from signal lines flowing in a substrate according to an embodiment of the present disclosure.
Figure 5A:
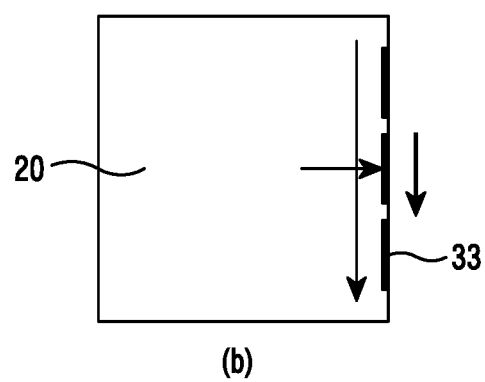

FIG. 5A illustrates a shield structure of noise that is generated from signal lines flowing in a substrate according to an embodiment of the present disclosure.

Referring to FIG. 5A(a), when an internal signal line exists in the PCB 20, the noise emanated from the signal line may leak out to the outside.

Figure 6:
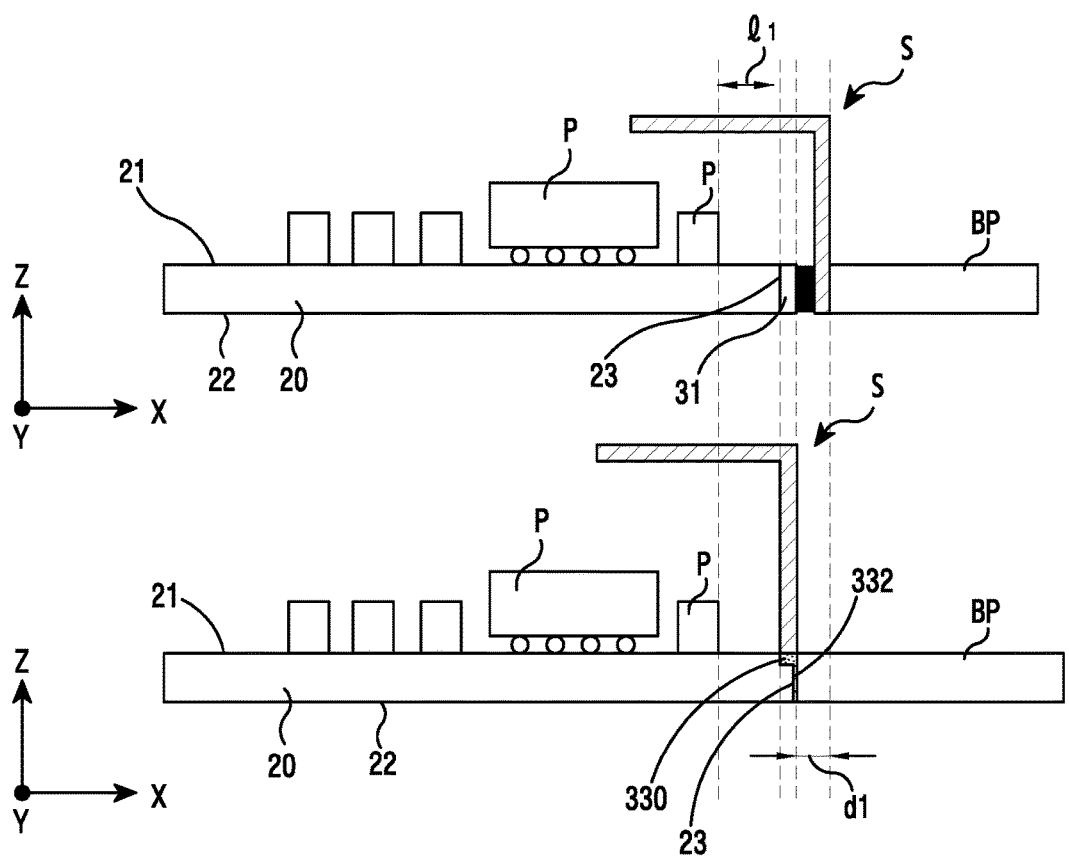
FIG. 6 illustrates a comparison of a plurality of shield unit mounting structures according to an embodiment of the present disclosure.

Referring to FIG. 5A(b), in order to prevent noise, which is generated from the PCB 20, from leaking out to the outside, the side surfaces of the PCB 20 may be plated to block the noise. The shield effect may be provided by a side surface plating portion 33 of the PCB. That is, the noise generated from a wiring of the PCB 20 may be suppressed from leaking out by the side surface plating portion 33 that is connected to a ground of the PCB 20. A performance of suppressing EMI may be improved through a non-illustrated via hole (e.g., a via hole 320 as illustrated in FIG. 6).

Figure 5B:
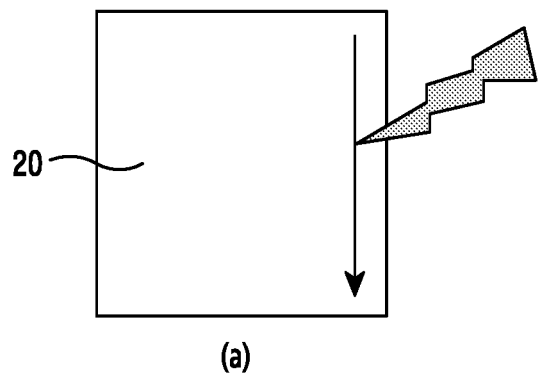
FIG. 5B illustrates a shield structure of an ESD according to an embodiment of the present disclosure.
Figure 5B:
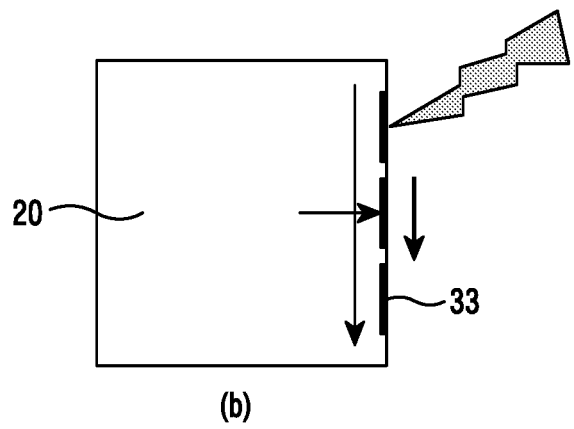

FIG. 5B illustrates a shield structure of an ESD according to an embodiment of the present disclosure.

Referring to FIG. 5B(a), when a signal line (wiring) exists in the PCB 20, the ESD, which has been generated from the outside, may infiltrate into the PCB 20 and may affect the internal wiring of the PCB 20.

Referring to FIG. 5B(b), in order to block the ESD from infiltrating into the PCB 20 and affecting the wiring of the PCB, the side surfaces of the PCB may be plated. The ESD may flow along the side surface plating portion 33, rather than infiltrating into the PCB 20, due to the side surface plating portion 33.

As will be described in detail below, according to an embodiment of the present disclosure, the PCB may further include a plating region that is formed on the side surface thereof in addition to the pads that are formed on the top surface and/or the bottom surface thereof, such that a pad on the top surface of the PCB is used as a connecting portion of a shield unit, and the side surface plating portion on the side surface of the PCB is arranged to be at least partially exposed at the periphery of the PCB, thereby blocking the internal noise that is generated in the PCB and preventing the infiltration of ESD into the inside of the PCB.

FIG. 6 illustrates a comparison of a plurality of shield unit mounting structures according to an embodiment of the present disclosure. Specifically, FIG. 6 illustrates two shield unit mounting structures, in which the structure in the upper portion of FIG. 6 corresponds to a conventional shield unit mounting structure as illustrated in FIG. 7, and the structure in the lower portion of FIG. 6 corresponds to a shield unit mounting structure according to an embodiment of the present disclosure, as illustrated in FIG. 8.

Figure 7:
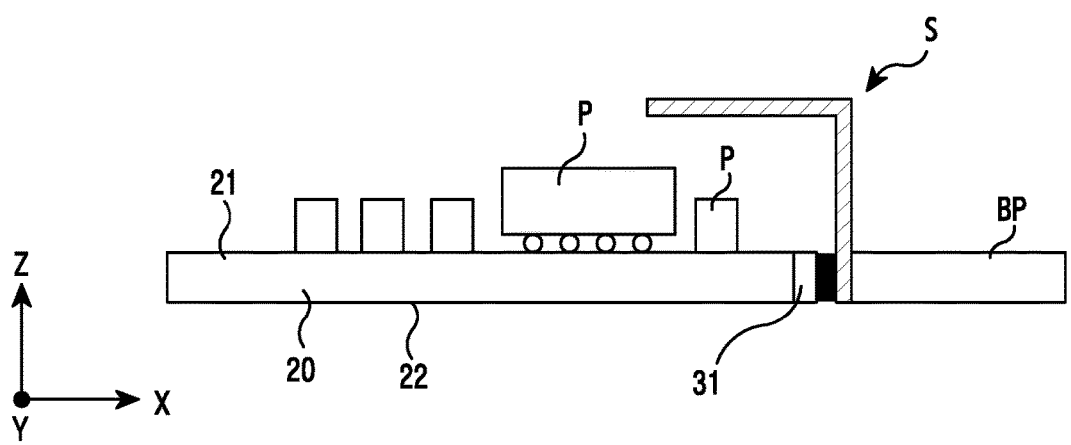
FIG. 7 is a cross-sectional view illustrating a shield unit conventionally mounted on a PCB.
Figure 8:
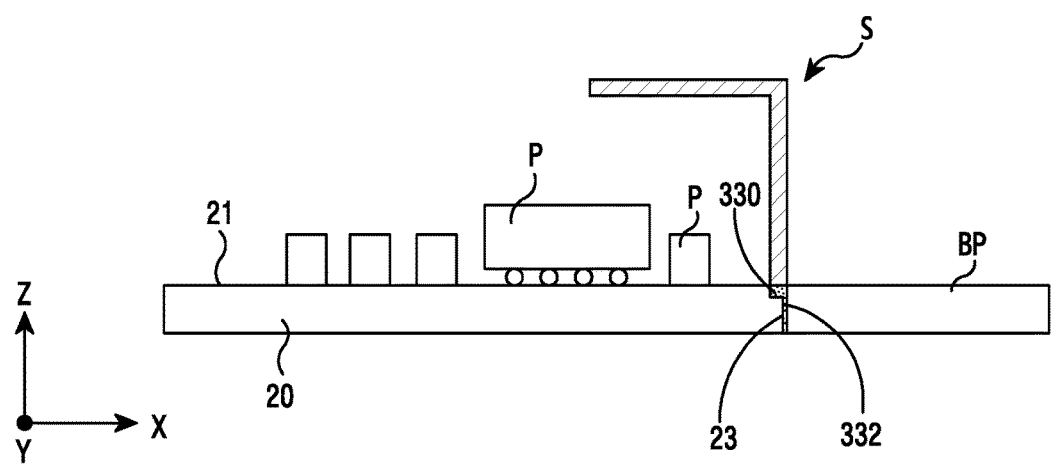
FIG. 8 is a cross-sectional view illustrating a shield unit mounted on a PCB according to an embodiment of the present disclosure.

FIG. 7 is a cross-sectional view illustrating a shield unit conventionally mounted on a PCB.

Referring to FIGS. 6 and 7, the PCB 20 includes top and bottom surfaces 21 and 22, on which electronic components may be mounted. Herein, descriptions will be made, by way of an example, with reference to a PCB that is mounted with a plurality of electronic components on the top surface 21. The related components P are mounted on the PCB 20 to be enclosed by a shield unit S. The shield unit S may block an electric interference signal and may spatially shield the mounted components P from a signal radiated to the space. The shield unit S mounting structure is of a shield unit side surface SMD type in which a side surface plating portion 31 is formed on the side surface 23 of the PCB, and the shield unit S is bonded to the side surface plating portion 31 through a surface mounting process.

In order to block generated noise, the conventional substrate includes a via hole (not shown).

The plurality of mounted components P may be electronic components that are associated with an RF unit, power, or a processor.

Reference numeral $Q_1$ denotes a spaced distance between the electronic components P and the shield unit S, and BP denotes a battery pack, in FIG. 6.

However, when the shield unit S is connected to the side surface 23 of the PCB, a shield unit mounting space (in the X-axis direction) is needed on the side surface of the PCB, which reduces a component wiring space or mounting space.

FIG. 8 is a cross-sectional view illustrating a shield unit mounted on a PCB according to an embodiment of the present disclosure.

Referring to FIGS. 6 and 8, a shield unit mounting structure includes the PCB 20, a pad 330 that is formed on the top surface 21 of the PCB 20, a plating portion 332 that is formed on the side surface 23 of the PCB, and the shield unit S that is connected to the pad 330. On the top surface 21, the plurality of components P may be mounted through a surface mounting process. The plurality of mounted components P may be electronic components that are associated with an RF unit, power, or a processor.

The shield unit S is mounted over the components P to enclose the components P.

As described above, the shield unit S is connected to the pad 330. The actual connecting position of the shield unit S may be fully included in the region of the pad 330, or may be slightly shifted toward the side surface plating portion 332 (in the X-axis).

The top surface pad 330 and the side surface plating portion 332 may be configured to be directly connected to each other. In addition, on the top surface pad 330 and the side surface plating portion 332, the pad 330 may be formed first and then the side surface plating portion 332, when the PCB 20 is fabricated. In addition, the top surface pad 330 and the side surface plating portion 332 may be formed to have different plating thicknesses, respectively. For example, the thickness of the side surface plating portion 332 may be smaller than that of the pad 330.

The top surface pad 330 may be formed on the PCB 20 through a soldering process or a process other than the soldering process.

Upon comparing with the conventional shield unit mounting structure illustrated in FIG. 7 to the shield unit mounting structure according to an embodiment of the present disclosure as illustrated in FIG. 8, the shield unit mounting structure of FIG. 8 secures a distance dl, i.e., a space. That is, the space to be occupied by the via hole and the shield unit may be used as a component mounting space. For example, the space may be used as a battery pack BP mounting space adjacent to the side surface plating portion 31.

Figure 9:
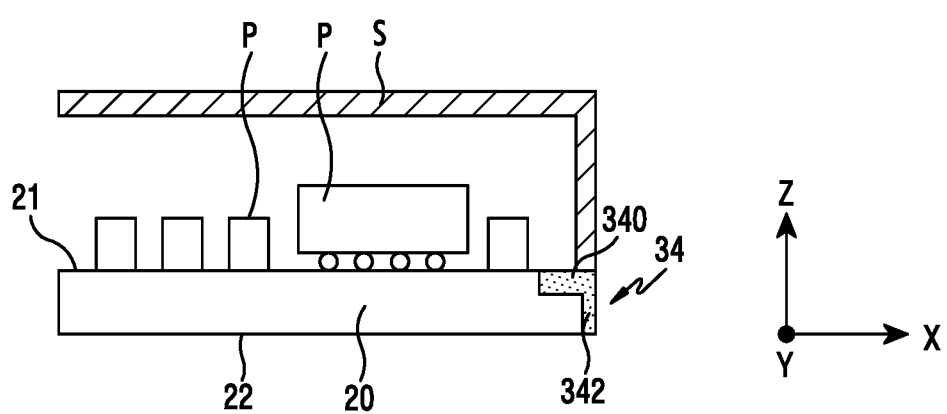
FIG. 9 is a cross-sectional view illustrating a shield unit mounted on a PCB according to an embodiment of the present disclosure.

FIG. 9 is a cross-sectional view illustrating a shield unit mounted on a PCB according to an embodiment of the present disclosure.

Referring to FIG. 9, a shield unit mounting structure includes the PCB 20, a pad 340, a side surface plating portion 342, and the shield unit S that is connected to the pad 340. On the top surface 21, the plurality of components P may be mounted through a surface mounting process. The shield unit S is connected to the pad 340 on the top surface (hereinafter, referred to as a "top surface pad").

A plating portion 34 includes the top surface pad 340 and the side surface plating portion 342. The top surface pad 340 and the side surface plating portion 342 may be configured to be directly connected to each other.

Both the top surface pad 340 and the side surface plating portion 342 may be formed to have a right-angled cross-sectional shape. The top surface pad 340 and the top surface 21 of the PCB may be formed to be substantially flush with each other, and the side surface plating portion 342 may be formed to be substantially flush with a side surface of the shield unit S. In addition, the side surface plating portion 342 may be formed to be substantially flush with a side surface of the shield unit S so that the side surface of the PCB 20 may be arranged to be substantially flush with the side surface of the shield unit S.

The top surface pad 340 is connected to the shield unit S, and a component wiring space or support space may be secured while the EMI/EMC/ESD is further suppressed by the side surface plating portion 342. Further, the mounting structure is also excellent.

Figure 10:
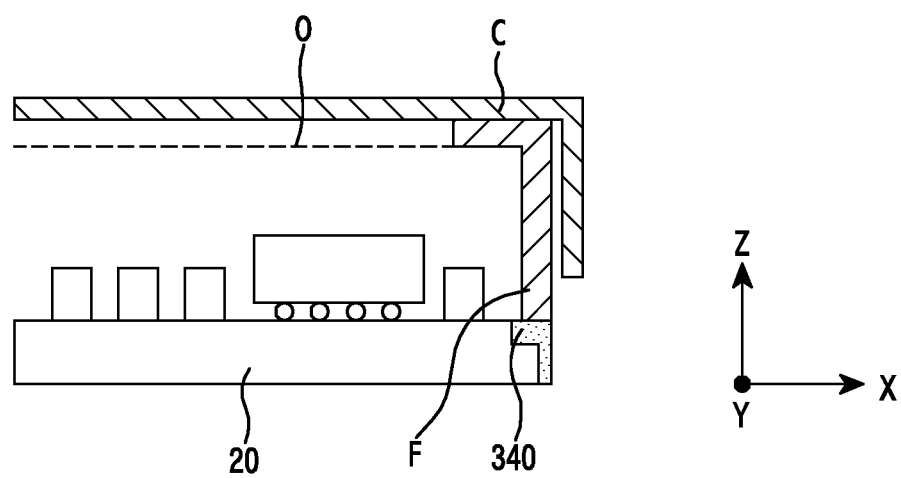
FIG. 10 is a cross-sectional view illustrating a shield unit mounted on a PCB according to an embodiment of the present disclosure.

FIG. 10 is a cross-sectional view illustrating a shield unit mounted on a PCB according to an embodiment of the present disclosure Because the shield unit mounting structure in FIG. 10 is the same as that illustrated in FIG. 9, except for the configuration of the shield unit S, repetitive descriptions thereof will be omitted. Referring to FIG. 10, a shield unit includes a shield frame F and a shield cover C. The shield frame F and the shield cover C may be independently fabricated and may then be coupled to each other. The shield frame F has a vertical wall type shape, and may be arranged to stand upright on the PCB 20 in the state in which it is connected to the top surface pad 340. The shield cover C may be arranged horizontally to cover the upper side of the shield frame F. The shield frame F may be connected to the top surface pad 340. The shield cover C may be arranged to cover the opened top end of the shield frame F to block the top end from the outside FIG. 11A is a cross-sectional view illustrating a shield unit mounted on a PCB according to an embodiment of the present disclosure.

Figure 11A:
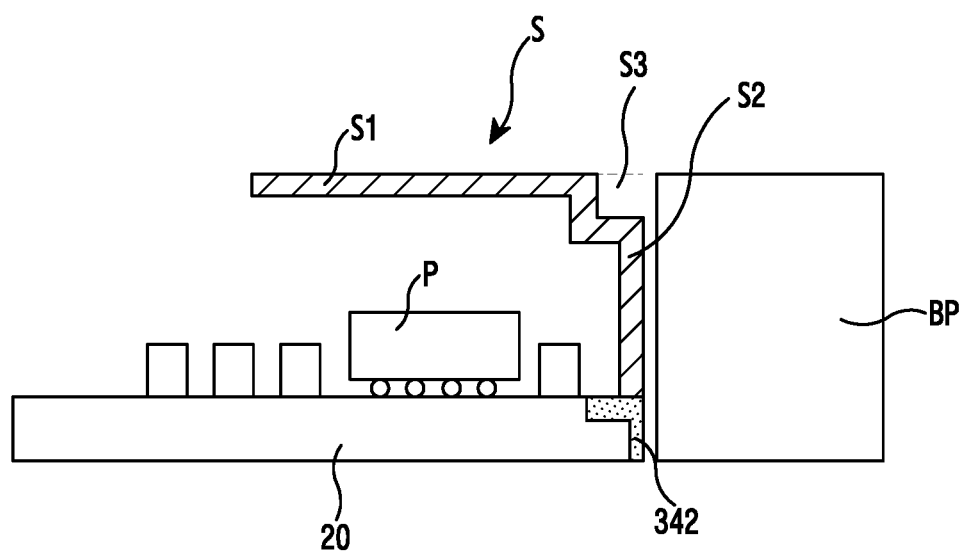
FIG. 11A is a cross-sectional view illustrating a shield unit mounted on a PCB according to an embodiment of the present disclosure.

Referring to FIG. 11A, the shield unit S (shield structure) is positioned above the electronic component P to shield the electronic component P. A location at which a cap s1 and a sidewall s2 are joined to each other is formed as a step in order to form an additional component space S3. In the space S3, a component, such as a coaxial cable, may be mounted. The battery pack BP may be arranged in parallel to the PCB 20, the side surface plating portion 342, or the shield unit S.

Figure 11B:
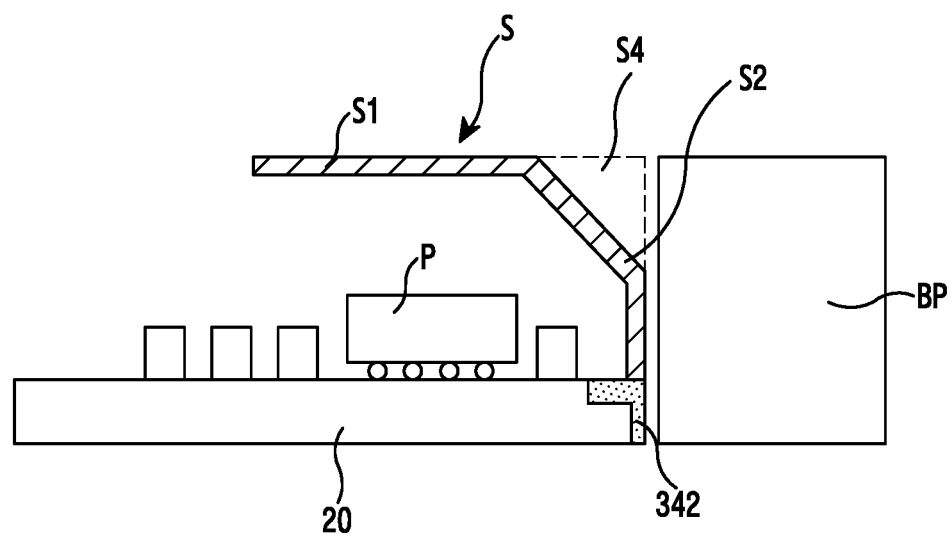
FIG. 11B is a cross-sectional view illustrating a shield unit mounted on a PCB according to an embodiment of the present disclosure.

FIG. 11B is a cross-sectional view illustrating a shield unit mounted on a PCB according to an embodiment of the present disclosure.

Referring to FIG. 11B, the shield unit S is positioned above the electronic component P to shield the electronic component P. A location at which the cap S1 and the sidewall S2 are joined to each other is formed obliquely in order to form an additional component mounting space S4. The oblique extent may be determined in consideration of the position and/or height of the component P. In the space S4, a component, such as a coaxial cable, may be mounted. The battery pack BP may be arranged in parallel to the PCB 20, the side surface plating portion 342, or the shield unit S.

Figure 11C:
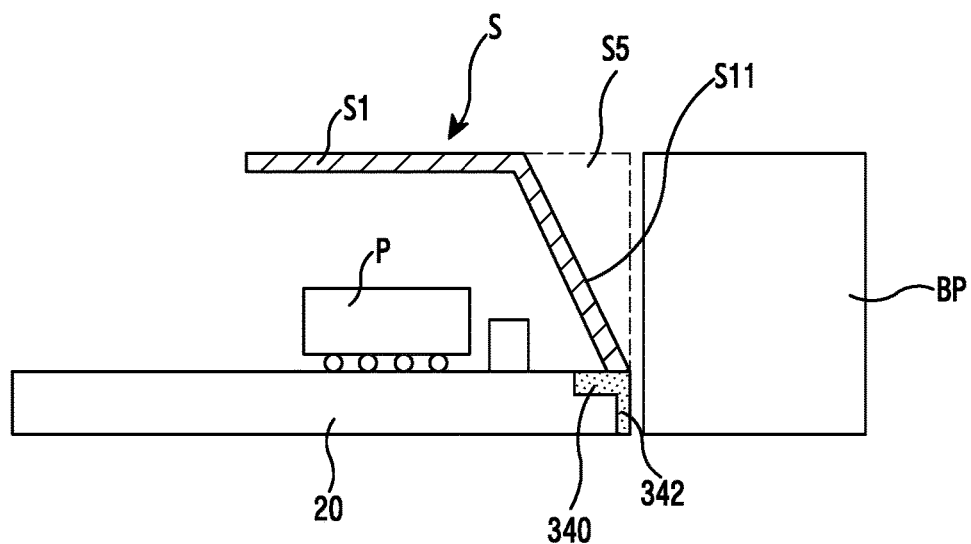
FIG. 11C is a cross-sectional view illustrating a shield unit mounted on a PCB according to an embodiment of the present disclosure.

FIG. 11C is a cross-sectional view illustrating a shield unit mounted on a PCB according to an embodiment of the present disclosure.

Referring to FIG. 11C, the shield unit S is positioned above the electronic component P to shield the electronic component P. A sidewall S11 is formed obliquely in order to form an additional component mounting space S5. The oblique extent of the sidewall S11 may be determined in consideration of the position and/or height of the component P. In the space S5, a component, such as a coaxial cable, may be mounted. The battery pack BP may be arranged in parallel to the PCB 20, the side surface plating portion 342, or the shield unit S.

Figure 12:
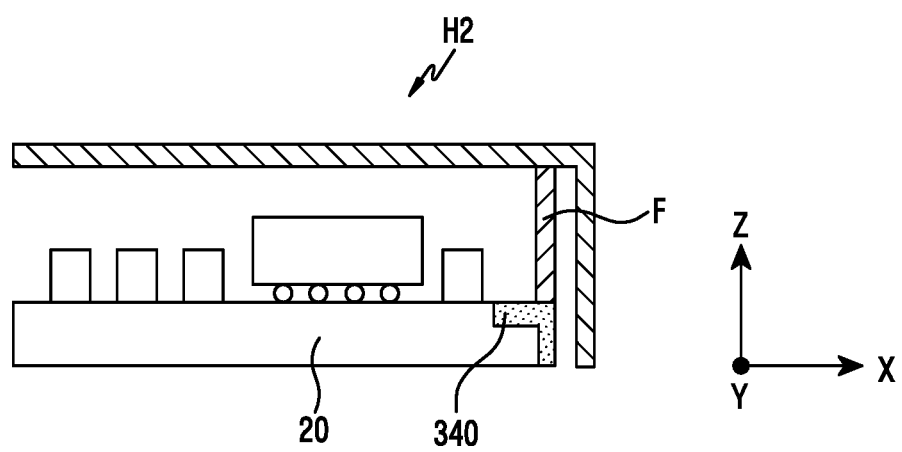
FIG. 12 is a cross-sectional view illustrating a shield unit mounted on a PCB according to an embodiment of the present disclosure.

FIG. 12 is a cross-sectional view illustrating a shield unit mounted on a PCB according to an embodiment of the present disclosure.

Referring to FIG. 12, a shield unit includes a shield frame F and an exterior housing H2. Each of the shield frame F and the exterior housing H2 may be made of a metal material. The shield frame F and the exterior housing H2 may be fabricated as a single product, or may be independently fabricated and then bonded to each other. The exterior housing H2 and the shield frame F may be connected to each other via a conductive material in order to improve the bonding force therebetween. The shield frame F has a vertical wall type shape, and is arranged to stand upright on the PCB 20 where it is connected to the top surface pad 340. The exterior housing H2 is arranged horizontally to cover the upper side of the shield frame F. The shield frame F may be connected to the top surface pad 340, and the exterior housing H2 may not be connected to the top surface pad 340. The exterior housing H12 may be arranged to cover the shield frame F, so as to shield the shield frame F from the outside, and may be arranged to enclose the shield frame F.

The shield frame F may be mounted on the top surface pad in an SMD type, may be connected to the top surface pad via a clip that is surface-mounted on the top surface pad 340, or may be connected to the top surface pad 340 via a tape that is attached to the top surface pad 340.

In addition, the shield frame F may be connected to the top surface pad 340 by being connected to a conductive material, or the shield frame F itself may be connected to the top surface pad 340 by a force applied thereto by the housing H2 without being surface-mounted.

Figure 13A:
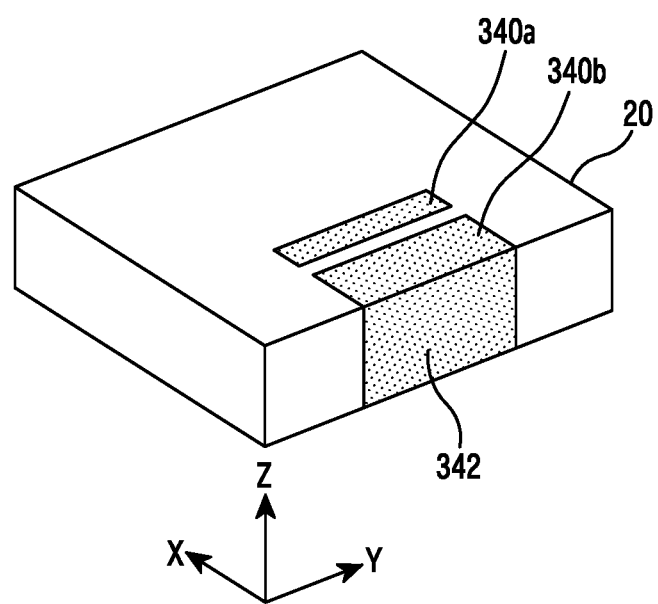
FIG. 13A illustrates a top surface pad and a side surface plating portion, which are formed on a PCB, according to an embodiment of the present disclosure.

FIG. 13A illustrates a top surface pad and a side surface plating portion, which are formed on a PCB, according to an embodiment of the present disclosure.

Figure 13B:
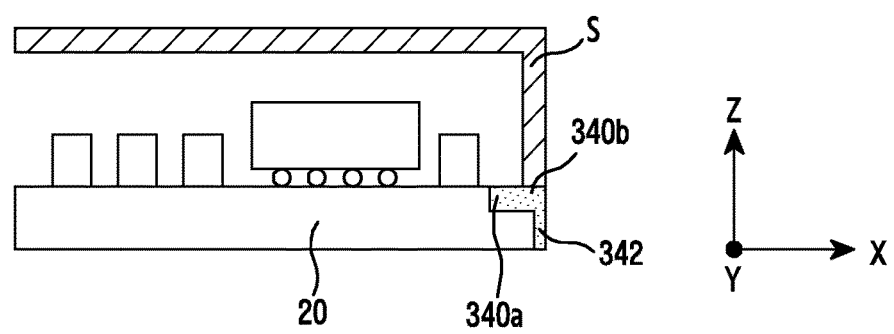
FIG. 13B is a cross-sectional view illustrating a shield unit mounted on a PCB according to an embodiment of the present disclosure.

FIG. 13B is a cross-sectional view illustrating a shield unit mounted on a PCB according to an embodiment of the present disclosure.

Figure 13C:
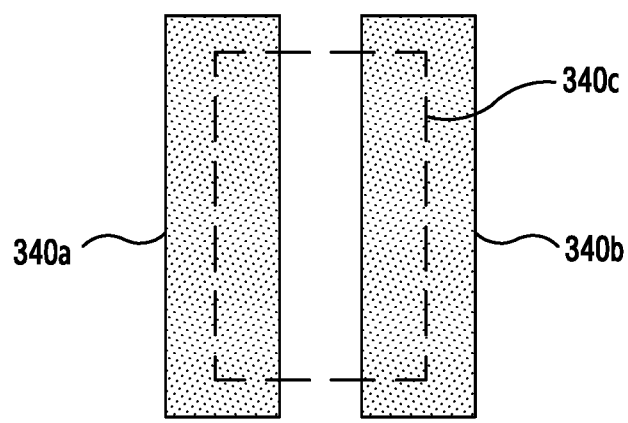
FIG. 13C illustrates a shield unit of a connecting region in a portion of a top surface pad and a side surface plating portion, which are formed on a PCB, according to an embodiment of the present disclosure.

FIG. 13C illustrates a shield unit of a connecting region in a portion of a top surface pad and a side surface plating portion, which are formed on a PCB, according to an embodiment of the present disclosure.

Referring to FIGS. 13A to 13C, a plurality of top surface pads 340a and 340b are formed on the PCB 20 along a first direction. The first and second top surface pads 340a and 340b are spaced apart from each other in the first direction from the outermost side surface of the substrate 20. At least a portion of the second top surface pad 340b is a portion of the upper end surface of the side surface plating portion 342.

When a shield unit S is connected to the first and second top surface pad 340a and 340b, the first and second top surface pads 340a and 340b may be indirectly connected to the shield unit S via the connecting region 340c. In addition, the shield unit S may be the exterior housing that is exposed to the outside of the electronic device and is made of a metallic material.

The top surface pads 340a and 340b may be configured to be directly connected to the side surface plating portion 342 (e.g., as illustrated in FIG. 10), or may be configured to be indirectly connected to the side surface plating portion 342 via the shield unit S.

Figure 14:
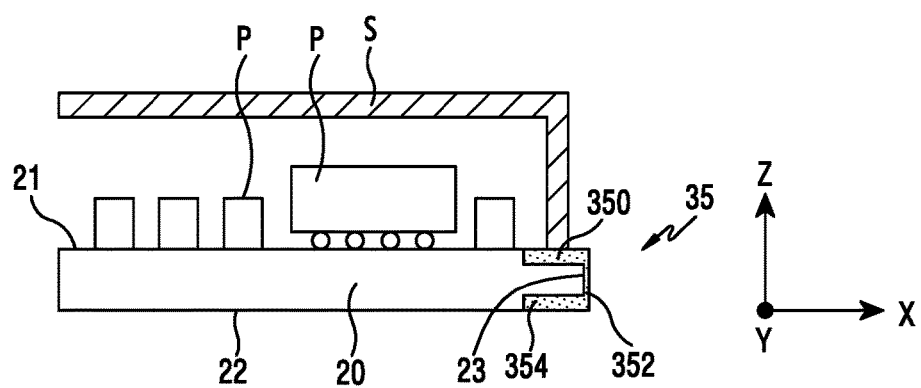
FIG. 14 is a cross-sectional view illustrating a shield unit mounted on a PCB according to an embodiment of the present disclosure.

FIG. 14 is a cross-sectional view illustrating a shield unit mounted on a PCB according to an embodiment of the present disclosure.

Referring to FIG. 14, the shield unit mounting structure includes the PCB 20, a plating portion 35 that is formed over the top surface 21, the side surface 23, and the bottom surface 22 of the PCB 20, and the shield unit S that is connected to the plating portion 35 in an SMD type.

On the top surface 21, the plurality of components P may be mounted through in an SMD type a surface mounting process, and the plurality of mounted components P may be electronic components that are associated with an RF unit, power, or a processor. The shield unit S shields the components P.

The connecting position of the shield unit S may be centered within the region of the top surface pad 350 as illustrated in FIG. 14, or may be shifted toward the side surface plating portion 352 (in the X-axis direction).

The plating portion 35 includes a top surface pad 350, a side surface plating portion 352, and a bottom surface pad 354. The top surface pad 350, the side surface plating portion 352, and the bottom surface pad 354 may be configured to be directly or indirectly connected to each other. In addition, the top surface pad 350, the side surface plating portion 352, and the bottom surface pad 354 may be formed at the time of fabricating the PCB 20, e.g., in the following sequence: top surface pad 350 is formed, then the bottom surface pad 354 is formed, and then side surface plating portion 352 is formed. However, the fabricating sequence is not limited.

In addition, the top surface pad 350, the side surface plating portion 352, and the bottom surface pad 354 may be formed to have substantially the same thicknesses or different thicknesses, respectively. The side surface plating portion 352 may be formed to have a plating thickness that is larger than the thicknesses of the top surface pad 350 and the bottom surface pad 354.

Both the top surface pad 350 and the side surface plating portion 352 may be configured to have a rectangular cross-sectional shape. Both the side surface plating portion 352 and the bottom surface pad 354 may be configured to have a rectangular cross-sectional shape. The top surface pad 350 and the bottom surface pad 354 may be formed to be parallel to each other. The top surface pad 350 may be formed to be substantially flush with the top surface 21 of the PCB, the bottom surface pad 354 may be formed to be substantially flush with the bottom surface 23 of the PCB, and the side surface plating portion 352 may be formed to be substantially parallel to the side surface 23 of the PCB.

The top surface pad 350 is connected to the shield unit so that the EMI/EMC/ESD is suppressed by the side surface plating portion 352, a component wiring space or support space is secured, and the mounting structure is also excellent.

Figure 15:
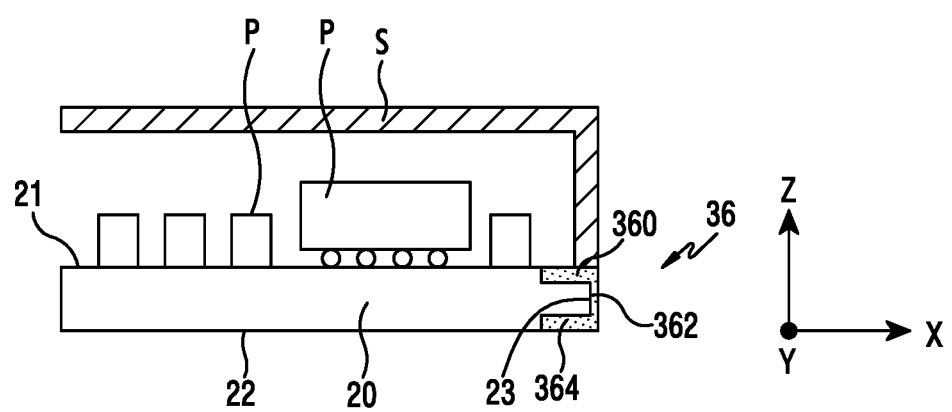
FIG. 15 is a cross-sectional view illustrating a shield unit mounted on a PCB according to an embodiment of the present disclosure.

FIG. 15 is a cross-sectional view illustrating a shield unit mounted on a PCB according to an embodiment of the present disclosure.

Referring to FIG. 15, the shield unit mounting structure includes the PCB 20, a plating portion 36 that is formed over the top surface 21, the side surface 23, and the bottom surface 22 of the PCB 20, and the shield unit S that is bonded to the plating portion 36 on a top surface of the plating portion 36 in an SMD type. The plating portion 36 includes a top surface pad 360, a side surface plating portion 362, and a bottom surface pad 364. Differently than FIG. 14, in FIG. 15, the side wall of the shield unit S and the side surface plating portion 362 are arranged to be flush with each other along a substantially vertical direction.

Figure 16A:
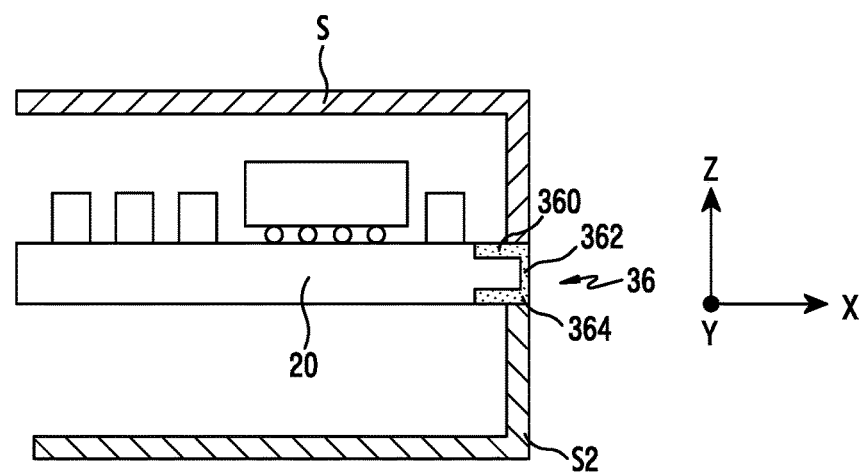
FIG. 16A is a cross-sectional view illustrating a shield unit mounted on a PCB according to an embodiment of the present disclosure.

FIG. 16A is a cross-sectional view illustrating a shield unit mounted on a PCB according to an embodiment of the present disclosure.

The shield unit mounting structure in FIG. 16A is the same as that illustrated in FIG. 15, except that a bottom shield unit S2 is added thereto. Accordingly, repetitive descriptions of FIG. 16A will be omitted. Referring to FIG. 16A, the bottom shield unit S2 is mounted on the bottom surface pad 364, similarly to the top shield unit S being mounted on the top surface pad 360. That is, the top shield unit S and bottom shield unit S2 may be mounted to share a single plating portion 36. The top and bottom shield units S and S2 are opposed to each other with reference to the PCB 20. As described above, the plating portion 36 includes the top surface pad 360 on the top surface of the PCB 20, and the bottom surface pad 364 on the bottom surface of the PCB 20.

In addition, a plurality of components may be mounted on the bottom surface of the PCB 20, and the bottom shield unit S2 may be arranged to shield the plurality of components, the bottom shield unit S2 may be configured as an exterior housing that is exposed to the outside. The bottom shield unit S2 is also connected to the side surface plating portion 362 to perform the same function as that of the top shield unit S.

Figure 16B:
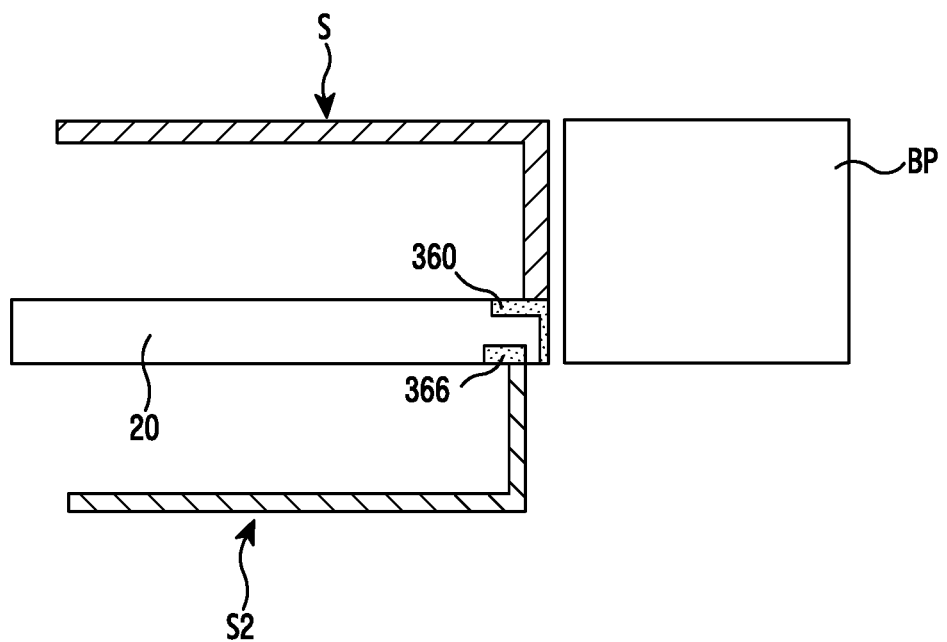
FIG. 16B is a cross-sectional view illustrating a shield unit mounted on a PCB according to an embodiment of the present disclosure.

FIG. 16B is a cross-sectional view illustrating a shield unit mounted on a PCB according to an embodiment of the present disclosure.

Referring to FIG. 16B, a bottom surface pad 366 is formed to be spaced apart from the side surface plating portion, and the bottom shield unit S2 is mounted on the bottom surface pad 366 like the top shield unit S is mounted on the top surface pad 360. The top and bottom shield units S and S2 may be arranged to be opposed to each other with reference to the PCB 20. In addition, the bottom shield unit S2 may be configured as an exterior housing that is exposed to the outside.

Because the bottom shield unit S2 is arranged to be spaced apart from the side surface plating portion, the bottom shield unit S2 may also perform the same function as the top shield unit S. The top shield unit S may be arranged next to the battery pack BP in parallel to the battery pack BP with a fine gap being formed therebetween, rather than overlapping with the battery pack BP.

Figure 17:
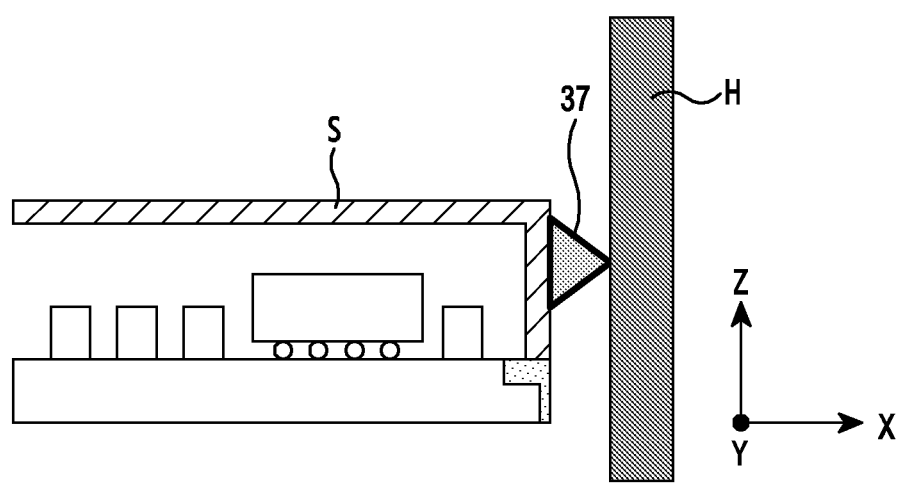
FIG. 17 is a cross-sectional view illustrating a connecting structure between a shield unit and a housing according to an embodiment of the present disclosure.

FIG. 17 is a cross-sectional view illustrating a connecting structure between a shield unit and a housing according to an embodiment of the present disclosure.

Referring to FIG. 17, at least a portion of the shield unit S is electrically connected to at least a portion of a housing H via at least one conducting unit 37. The conducting unit 37 may include components that are made of a conductive material to electrically conduct with each other, e.g., a contact terminal and a conductive poron. Using the conducting unit 37, the shield unit S may provide a configuration that is capable of extending the transmission of a signal that is generated from an electronic device ground GND or an electronic element, to another PCB, etc., that is connected to the electronic device ground.

Figure 18:
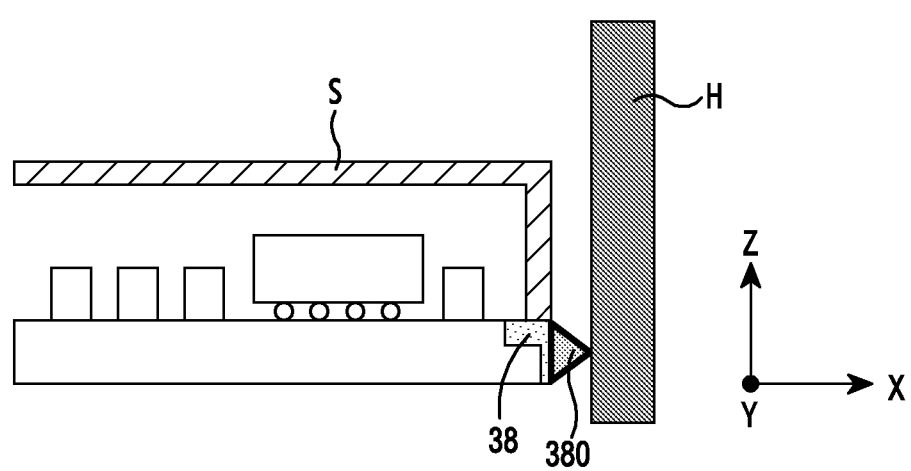
FIG. 18 is a cross-sectional view illustrating a connecting structure between a shield unit and a housing according to an embodiment of the present disclosure.

FIG. 18 is a cross-sectional view illustrating a connecting structure between a shield unit and a housing according to an embodiment of the present disclosure.

Referring to FIG. 18, a least a portion of the side surface plating portion 38 is electrically connected to at least a portion of a housing H via at least one conducting unit 380. The conducting unit 380 is interposed between the side surface plating 38 and the housing H so that the shield unit S and the side surface plating portion 38 may electrically conduct with the housing H. The conducting unit 380 may include components that are made of a conductive material to electrically conduct with each other, e.g., a contact terminal or the like. With the conducting unit 380, the shield unit S may provide a configuration that is capable of extending the transmission of a signal that is generated from a system ground GND or an electronic element, to another PCB 20, etc., that is connected to the system ground.

The conducting unit 380 may be configured to be at least partially elastic so that the close contact and connecting state between the side surface plating portion 38 and the housing H can be maintained.

Figure 19:
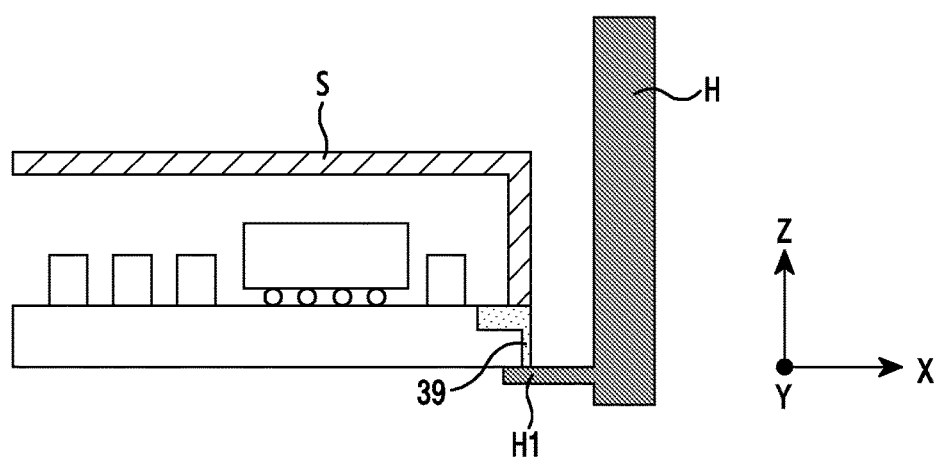
FIG. 19 is a cross-sectional view illustrating a connecting structure between a shield unit and a housing according to an embodiment of the present disclosure.

FIG. 19 is a cross-sectional view illustrating a connecting structure between a shield unit and a housing according to an embodiment of the present disclosure.

Referring to FIG. 19, a least a portion of a side surface plating portion 39 is electrically connected to at least a portion of a housing H via a conducting unit H1. The conducting unit H1 is interposed between the side surface plating portion 39 and the housing H so that the shield unit S and the side surface plating portion 39 may electrically conduct with the housing H. The conducting unit H1 may be a portion that integrally extends from the housing H. With the conducting unit H1, the shield unit S may provide a configuration that is capable of extending the transmission of a signal that is generated from a system ground GND or an electronic element, to another PCB, etc., that is connected to the system ground.

Although not illustrated in the drawing, a connecting terminal may be additionally interposed between the conducting unit H1 and the side surface plating portion 39. The conducting unit H1 may be arranged to be always in close contact with the bottom surface of the side surface plating portion 39 such that the close contact and connecting state between the side surface plating portion 39 and the housing H can be maintained.

Figure 20:
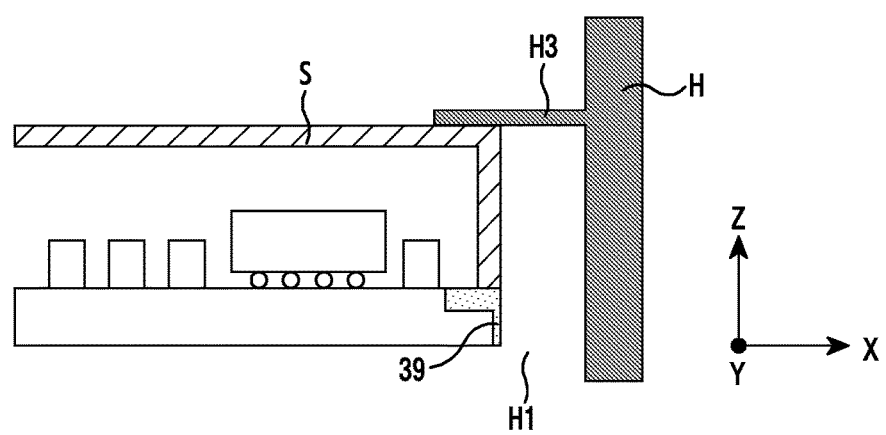
FIG. 20 is a cross-sectional view illustrating a connecting structure between a shield unit and a housing according to an embodiment of the present disclosure.

FIG. 20 is a cross-sectional view illustrating a connecting structure between a shield unit and a housing according to an embodiment of the present disclosure.

Referring to FIG. 20, the housing H is connected, via at least one conducting unit 1H3, to the top portion of the shield unit S that is electrically connected to the side surface plating portion 39, directly or indirectly. The shield unit S may be electrically connected to at least a portion of the housing H by the at least one conducting unit H3. The conducting unit H3 may include components that are made of conductive material to electrically conduct with each other. Using the conducting unit H3, the shield unit S may provide a configuration that is capable of extending the transmission of a signal that is generated from a system ground GND or an electronic element, to another PCB 20, etc., that is connected to the system ground.

Figure 21A:
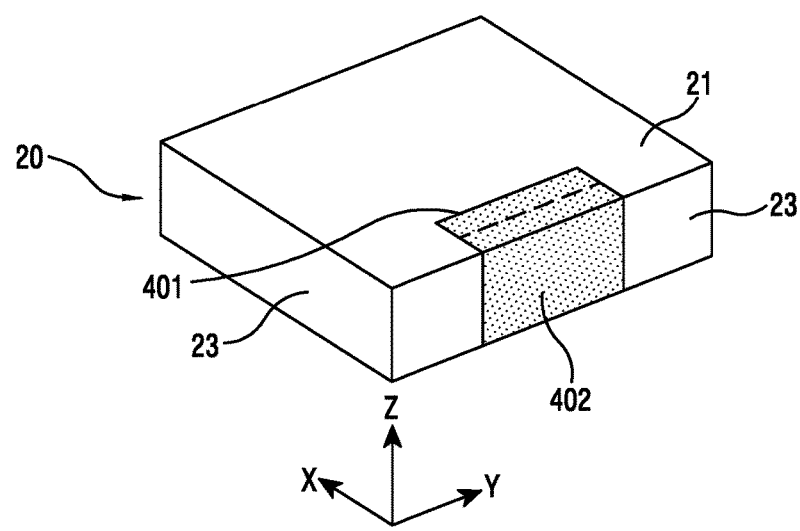
FIG. 21A illustrates a PCB, on which a connecting pad is formed, according to an embodiment of the present disclosure.

FIG. 21A illustrates a PCB, on which a connecting pad is formed, according to an embodiment of the present disclosure.

Figure 21B:
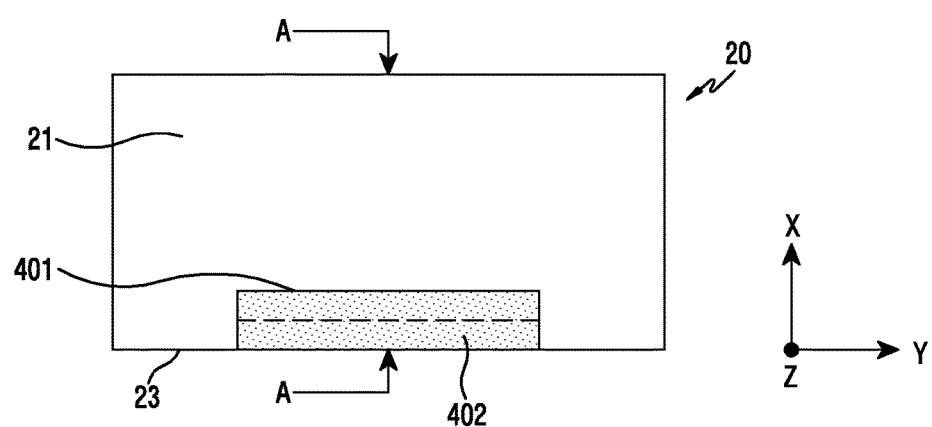
FIG. 21B is a plan view of FIG. 21A.

FIG. 21B is a plan view of FIG. 21A.

Figure 21C:
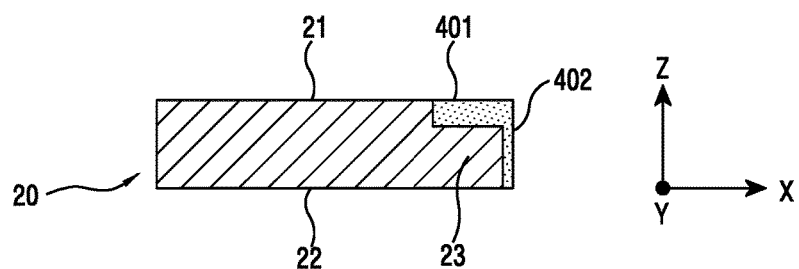
FIG. 21C is a cross-sectional view taken along line A-A in FIG. 21B.

FIG. 21C is a cross-sectional view taken along line A-A in FIG. 21B.

Referring to FIGS. 21A to 21C, the PCB 20 includes the top surface 21, a plurality of side surfaces 23, a pad surface 401 that is formed on the top surface 21, and a side surface plating portion 402 that is formed along one of the side surfaces 23. On the top surface 21 and the bottom surface 22 of the PCB 20, a plurality of components may be mounted in an SMD type.

The top surface pad 401 may include a region, to which a shield unit (e.g., a shield can or a housing) is connected. The region may refer to a connecting region.

While FIG. 21A illustrates only one top surface pad 401 and only one side surface plating portion 402 formed on the PCB 20, a plurality of top surface pads and a plurality of side surface plating portions may be formed and spaced apart from each other along the periphery of the PCB 20. Additionally, the top surface pads 401 and the side surface plating portion 402 may be implemented in various shapes.

Although FIGS. 21A to 21C illustrate an embodiment in which the top surface pad 401 and the side surface plating portion 403 are arranged in the 1:1 alignment state, the alignment may vary.

Figure 22A:
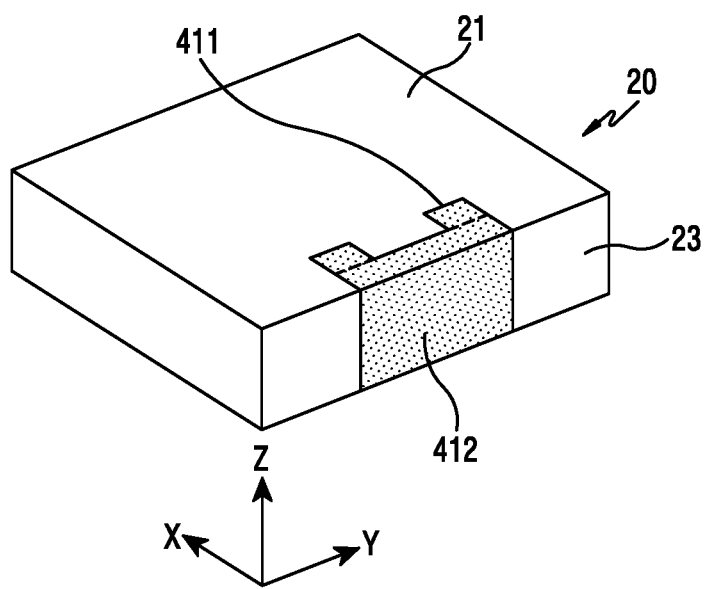
FIG. 22A illustrates a PCB according to an embodiment of the present disclosure.

FIG. 22A illustrates a PCB according to an embodiment of the present disclosure.

Figure 22B:
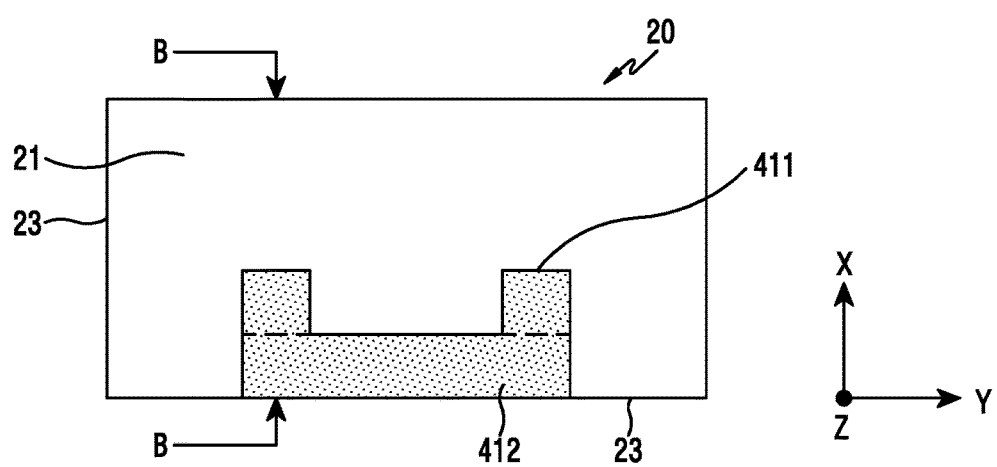
FIG. 22B is a plan view of FIG. 22A.

FIG. 22B is a plan view of FIG. 22A.

Figure 22C:
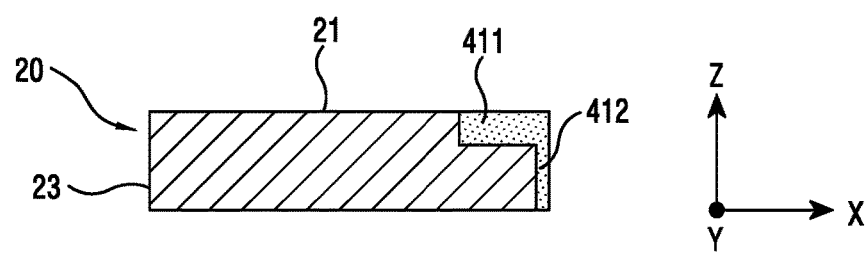
FIG. 22C is a cross-sectional view taken along line B-B in FIG. 22B.

FIG. 22C is a cross-sectional view taken along line B-B in FIG. 22B.

Referring to FIGS. 22A to 22C, the PCB 20 includes the top surface 21, the plurality of side surfaces 23, a top surface pad 411 that is formed on the top surface 21, and a side surface plating portion 412 that is formed along one of the side surfaces 23.

The top surface pad 411 and the side surface plating portion 412 may be integrally connected to each other. The top surface pad 411 may be formed to be substantially parallel to the top surface 21 of the PCB 20, or to be flush with the top surface 21 of the PCB. The side surface plating portion 412 may be formed to have a predetermined thickness and to be parallel to the side surface 23 of the PCB 20 or to be flush with the side surface 23 of the PCB 20. When the side plating portion is formed on the side surface of the PCB 20, the top end surface of the side surface plating portion 412 may become at least a portion of the top surface pad 411. As the plating thickness of the side surface plating portion 412 increases, the top end surface of the side surface plating portion 412 may have a wider region that operates as the top surface pad 411, i.e. a wider region that is connected to the shield unit.

The top surface pad 411 may include one or more regions, to which the shield unit is connected. For example, two or more connecting regions may be provided.

The shield unit may be arranged between the top surface pads 411 in order to prevent solder from being excessively overflowing when the shield unit is placed and surface-mounted. In addition, while FIG. 22A illustrates that only one top surface pad 411 and only one side surface plating portion 412 are formed on the PCB 20, a plurality of top surface pads and a plurality of side surface plating portions may be formed and spaced apart from each other along the periphery of the PCB 20.

Figure 23A:
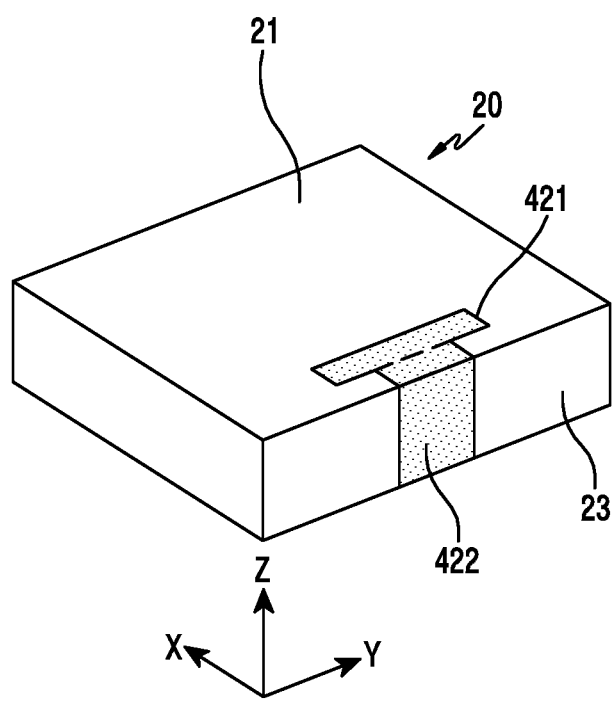
FIG. 23A illustrates a PCB according to an embodiment of the present disclosure.

FIG. 23A illustrates a PCB according to an embodiment of the present disclosure.

Figure 23B:
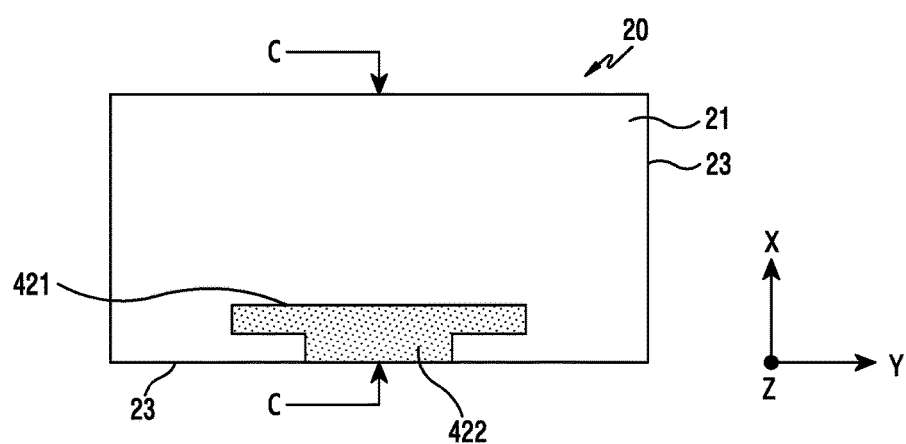
FIG. 23B is a plan view of FIG. 23A.

FIG. 23B is a plan view of FIG. 23A.

Figure 23C:
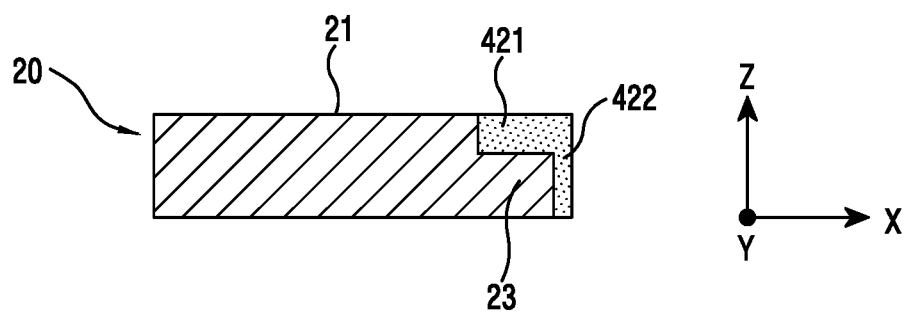
FIG. 23C is a cross-sectional view taken along line C-C in FIG. 23B.

FIG. 23C is a cross-sectional view taken along line C-C in FIG. 23B.

Referring to FIGS. 23A to 23C, the PCB 20 may include the top surface 21, the plurality of side surfaces 23, a top surface pad 421 that is formed on the top surface 21, and a side surface plating portion 422 that is formed along one of the side surfaces 23.

After the top surface pad 421 is formed on the top surface of the PCB 20, the side surface plating portion 422 may be formed on the side surface of the PCB 20. In addition, at least a portion of the top surface pad 421, which is formed on the top surface 21 of the PCB 20, may be formed through the side surface plating.

The PCB 20 may include the top surface pad 421 and the side surface plating portion 422. The top surface pad 421 and the side surface plating portion 422 may be integrally connected to each other. The top surface pad 421 may be formed to be substantially parallel to the top surface 21 of the PCB 20 or to be flush with the top surface 21 of the PCB 20.

The side surface plating portion 422 may be formed to be substantially parallel to the side surface 23 of the PCB 20 or to be flush with the side surface 23 of the PCB 20. The top surface pad 421 may be one or more connecting regions, to which the shield unit is connected.

In addition, while FIG. 23A illustrates only one top surface pad 421 and only one side surface plating portion 422 being formed on the PCB 20, a plurality of top surface pads and a plurality of side surface plating portions may be formed and spaced apart from each other along the periphery of the PCB 20.

Figure 24A:
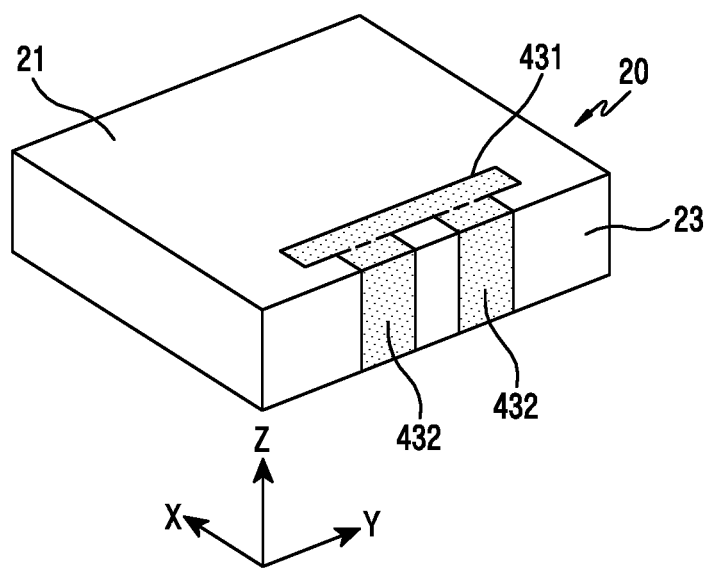
FIG. 24A illustrates a PCB according to an embodiment of the present disclosure.

FIG. 24A illustrates a PCB according to an embodiment of the present disclosure.

Figure 24B:
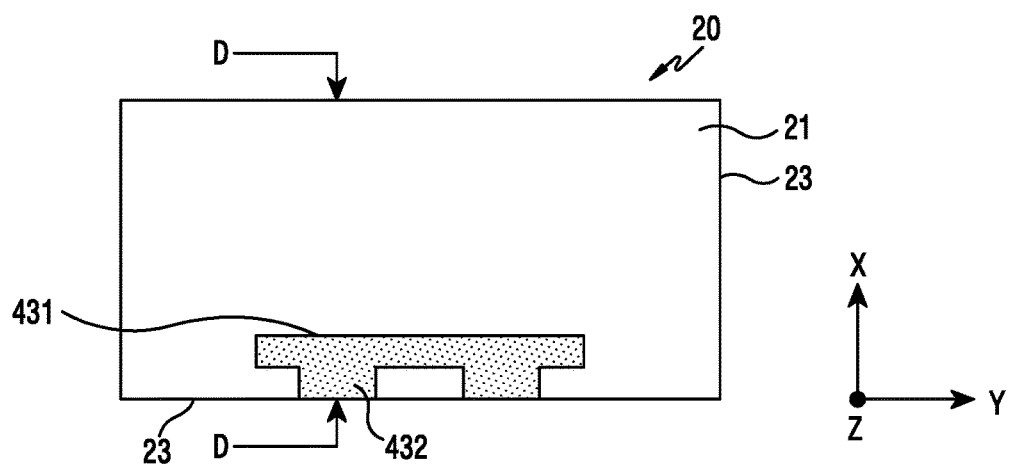
FIG. 24B is a plan view of FIG. 24A.

FIG. 24B is a plan view of FIG. 24A.

Figure 24C:
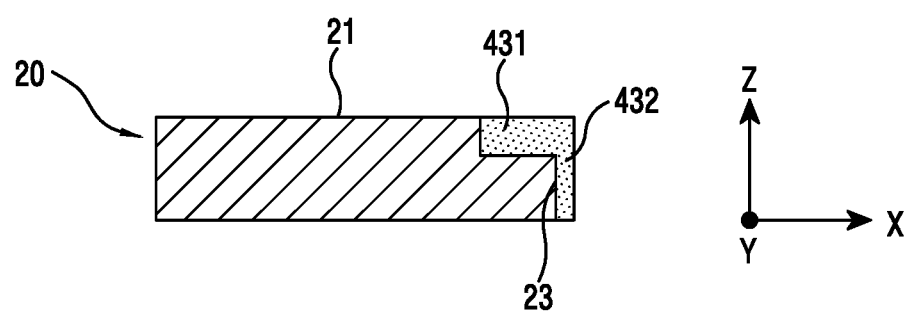
FIG. 24C is a cross-sectional view taken along line D-D in FIG. 24B.

FIG. 24C is a cross-sectional view taken along line D-D in FIG. 24B.

Referring to FIGS. 24A to 24C, the PCB 20 includes a top surface pad 431 that is formed on the top surface 21, and a plurality of side surface plating portions 432 that are formed along the side surface 23.

The top surface pad 431 and the side surface plating portion 432 may be integrally connected to each other. The top surface pad 431 may be formed to be substantially parallel to the top surface 21 of the PCB 20 or to be flush with the top surface 21 of the PCB 20. The side surface plating portion 432 may be formed to be substantially parallel to the side surface 23 of the PCB 20 or to be flush with the side surface 23 of the PCB 20. The top surface pad 431 may be a connecting region, to which the shield unit is connected. Two side surface plating portions 432 may be formed to be spaced apart from each other per one top surface pad 431.

While FIG. 24A illustrates only one top surface pad 431 and only two side surface plating portion 432 formed on the PCB 20, a plurality of top surface pads and more than two side surface plating portions may be formed and spaced apart from each other along the periphery of the PCB 20.

Figure 25:
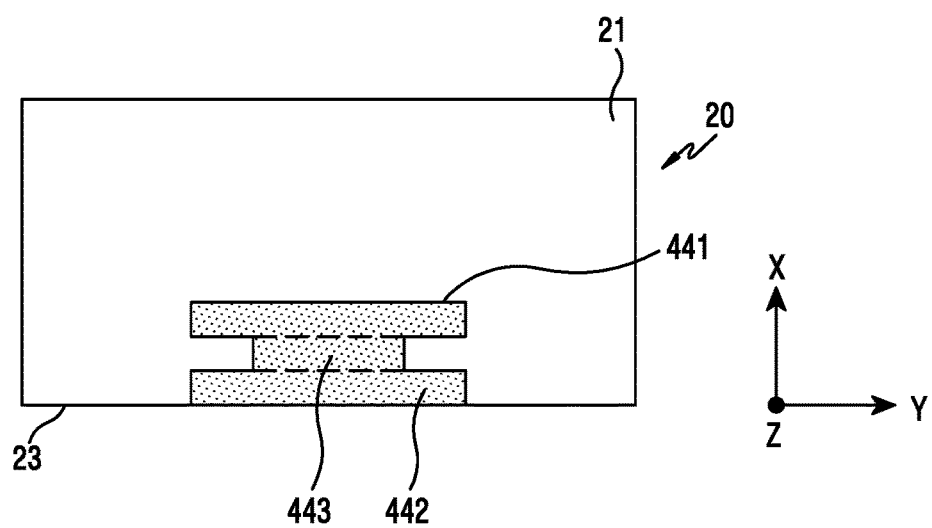
FIG. 25 illustrates a PCB according to an embodiment of the present disclosure.

FIG. 25 illustrates a PCB according to an embodiment of the present disclosure.

Referring to FIG. 25, the PCB 20 includes a top surface pad 441, a connecting pad 443, and a side surface plating portion 442 that is formed along the side surface 23. Detailed descriptions for the side surface plating portion 442 are omitted here, because the side surface plating portion 442 is configured the same as the side surface plating portion 412 illustrated in FIGS. 22A to 22C, which has already been described above.

The top surface pad 441 and the side surface plating portion 442 may be integrally connected to each other by the connecting pads 443. The top surface pad 441 may be formed to be substantially parallel to the top surface 21 of the PCB 20 or to be flush with the top surface 21 of the PCB 20. The top surface pad 441 may be a region in which a shield unit is connected. The top surface pad 441 may include the connecting pad 443, to which the shield unit is connected.

While FIG. 25 illustrates that only one top surface pad 441 and only one side surface plating portion 442 are formed on the PCB 20, a plurality of top surface pads and a plurality of side surface plating portions may be formed and spaced apart from each other along the periphery of the PCB 20.

Figure 26:
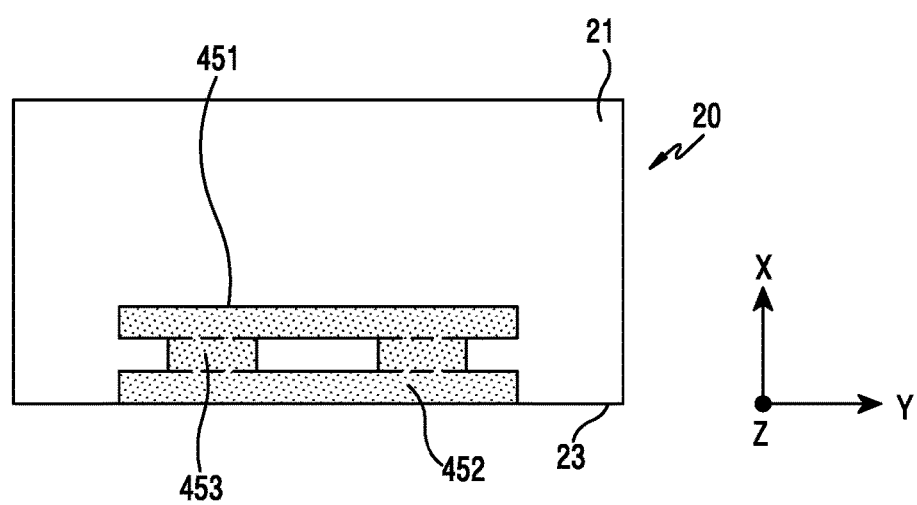
FIG. 26 illustrates a PCB, on which a plated portion is formed, according to an embodiment of the present disclosure.

FIG. 26 illustrates a PCB, on which a plated portion is formed, according to an embodiment of the present disclosure.

Referring to FIG. 26, the PCB 20 includes a top surface pad 451, a plurality of connecting pads 453, and a side surface plating portion 452 that is formed along the side surface 23.

Detailed descriptions for the side surface plating portion 452 are omitted because the side surface plating portion 452 is configured the same as the side surface plating portion 412 illustrated in FIGS. 22A to 22C, which has already been described above.

The top surface pad 451 and the side surface plating portion 452 may be integrally connected to each other by the connecting pads 453. The top surface 21 of the PCB 20, on which the top surface pad 451 is positioned, may be at least a portion of the periphery of the PCB 20. The top surface pad 451 may be formed to be substantially parallel to the top surface 21 of the PCB 20 or to be flush with the top surface 21 of the PCB 20. The top surface pad 451 may include a region to which the shield unit is connected.

The connecting pads 453 may be regions to be connected with the side surface plating portion 452.

While FIG. 26 illustrates only one top surface pad 451 and only one side surface plating portion 452 formed on the PCB 20, a plurality of top surface pads and a plurality of side surface plating portions may be formed and spaced apart from each other along the periphery of the PCB 20.

Figure 27:
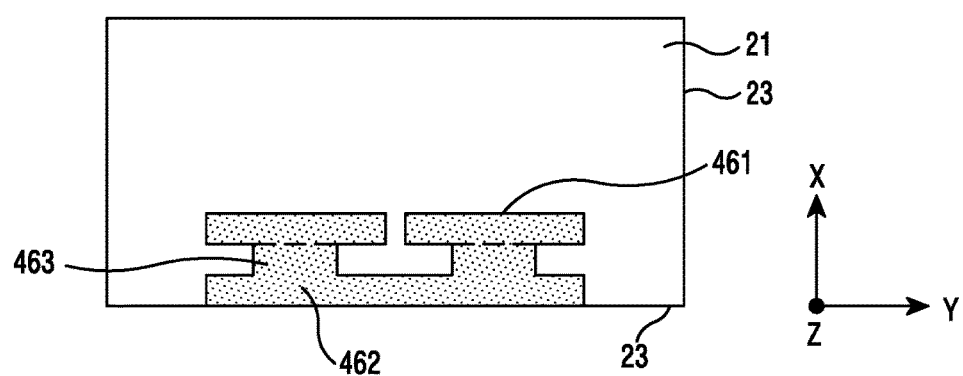
FIG. 27 illustrates a PCB according to an embodiment of the present disclosure.

FIG. 27 illustrates a PCB according to an embodiment of the present disclosure.

Referring to FIG. 27, the PCB 20 includes a plurality of top surface pads 461, a plurality of connecting pads 463, and a side surface plating portion 462 that is formed along the side surface 23. Detailed descriptions for the side surface plating portion 462 are omitted because the side surface plating portion 462 is configured the same as the side surface plating portion 412 illustrated in FIGS. 22A to 22C, which has been described above.

The top surface pads 461 and the side surface plating portion 462 may be integrally connected to each other by the connecting pads 463. The top surface 21 of the PCB 20, on which the top surface pads 461 are positioned, may be at least a portion of the periphery of the PCB 20. The top surface pads 461 may be formed to be substantially parallel to the top surface 21 of the PCB 20 or to be flush with the top surface 21 of the PCB 20. The top surface pads 461 may include regions, to which the shield unit is connected.

While FIG. 27 illustrates only two top surface pads 461, only two connecting pads 463, and only one side surface plating portion 462 being formed on the PCB 20, more than two plurality of top surface pads, more than two connecting pads, and a plurality of side surface plating portions may be formed and spaced apart from each other along the periphery of the PCB 20.

Figure 28:
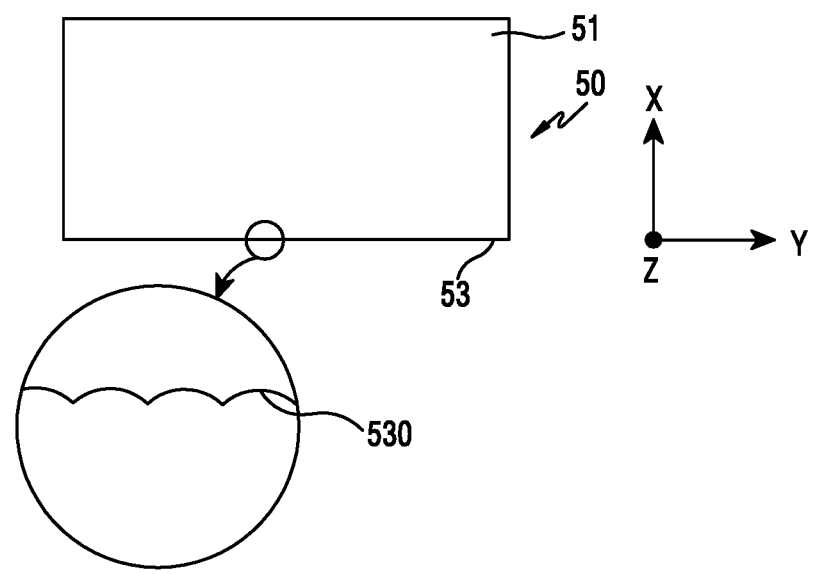
FIG. 28 illustrates a curved surface in a PCB according to an embodiment of the present disclosure in an enlarged scale.

FIG. 28 illustrates a curved surface in a PCB according to an embodiment of the present disclosure.

Figure 29:
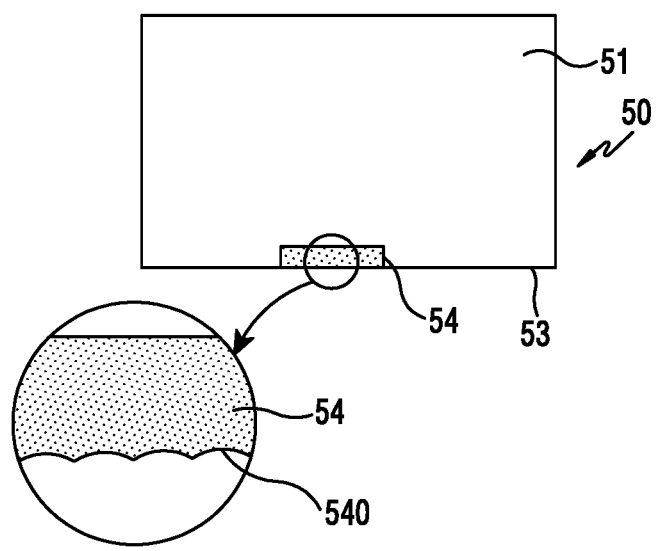
FIG. 29 illustrates a plated portion formed on a curved surface in a PCB according to an embodiment of the present disclosure.

FIG. 29 illustrates a plated portion formed on a curved surface in a PCB according to an embodiment of the present disclosure.

Referring to FIGS. 28 and 29, a PCB 50 includes a top surface 51, a bottom surface (not illustrated), and a plurality of side surfaces 53, in which at least a portion of the side surfaces 53 includes one or more curved surfaces 530. Among the side surfaces 53 of the PCB 50, a surface, on which a plating portion 54 is plated, may be formed as a curved surface 530. A plurality of curved surfaces 530 may be formed to be spaced apart from each other or to be continued along the side surfaces 53. The curved surfaces 530 may be configured to have a predetermined curvature. The curved surfaces 530 may be curved in an XY plane. The curved surfaces 530 may be formed to extend in the vertical direction (Z-axis direction).

The one or more curved surfaces 530 may be formed at the time of manufacturing the PCB 50 using a tool, such as a drill. Since the curved surfaces 530 are formed on the side surfaces 53 of the PCB 50 to increase a contact surface at the time of plating the plating portion 54, the plating portion 54 can be plated more stably as compared to a flat surface.

The curved surfaces 530 illustrated in FIG. 28 may be similarly applied to the PCBs 20 described above with reference to FIGS. 21 to 27.

As illustrated in FIG. 29, the plating portion 54, which is plated on the curved surfaces 530, may also be formed to have a curved pad surface 540.

Figure 30:
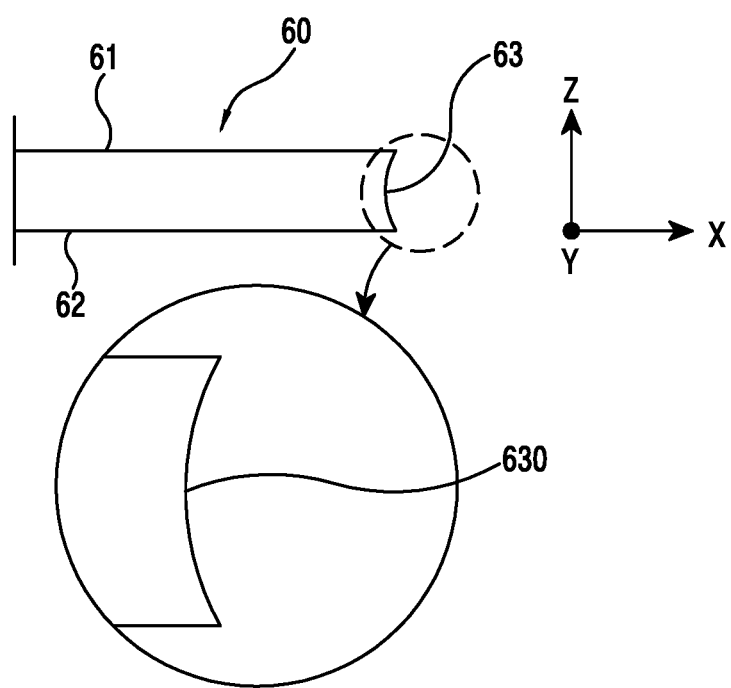
FIG. 30 illustrates a side surface of a PCB according to an embodiment of the present disclosure.

FIG. 30 illustrates a side surface of a PCB, on which a plating portion is formed, according to an embodiment of the present disclosure.

Figure 31:
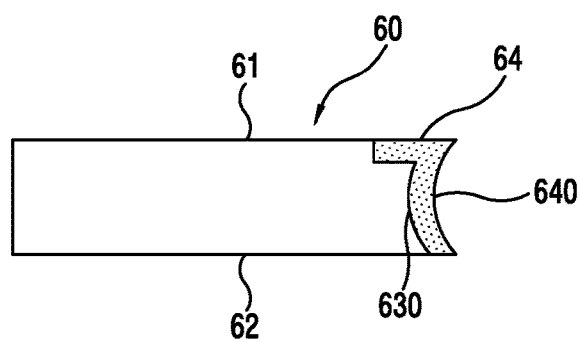
FIG. 31 illustrates a PCB according to an embodiment of the present disclosure.

FIG. 31 illustrates a plating portion plated on a PCB, according to an embodiment of the present disclosure.

Referring to FIGS. 30 and 31, a PCB 60 includes a top surface 61, a bottom surface 62, and a plurality of side surfaces 63, in which at least a portion or the entirety of the side surfaces 63 include one or more curved surfaces 630. Among the side surfaces 63 of the PCB 60, a surface, on which a plating portion 64 is plated, may be formed as a curved surface 630. The curved surfaces 630 may be formed to be continued along the side surfaces 63. The curved surfaces 630 may be configured to have a predetermined curvature. The curved surfaces 630 may be curved in an XZ plane. The curved surfaces 630 may be formed to extend in the horizontal direction (Y-axis direction).

The one or more curved surfaces 630 may be formed at the time of manufacturing the PCB 60 using a tool, such as a drill. The curved surfaces 630 are formed on the side surfaces 63 of the PCB 60 to increase a contact surface at the time of plating the plating portion 64. As a result, the plating portion 64 can be plated more stably as compared to plating to a flat side surface.

The curved surfaces 630 may be similarly applied to the PCBs 20 described above with reference to FIGS. 21 to 27.

As illustrated in FIG. 31, the plating portion 64, which is plated on the curved surfaces 630, may also be formed to have a curved pad surface 640.

Figure 32:
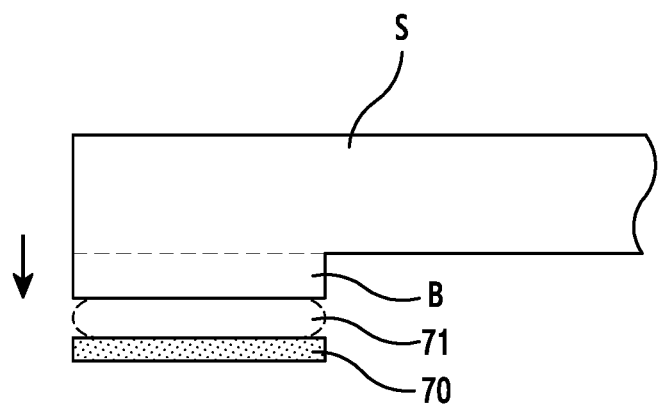
FIG. 32 illustrates a conventional process of mounting a shield unit on a top surface pad formed on a PCB.

FIG. 32 illustrates a conventional process of mounting a shield unit on a top surface pad formed on a PCB.

Referring to FIG. 32, the shield unit S is provided with a leg portion B to be connected to a top surface pad 70 (a connecting portion that is provided at the lower end to be connected with the top surface pad 70), and the leg portion B may be connected to the top surface pad 70 via solder 71. One leg portion B may be connected to one top surface pad 70. However, according to this connecting structure, the leg portion B of the shield unit often floats from the top surface pad 70, which may cause a poor connection.

Figure 33A:
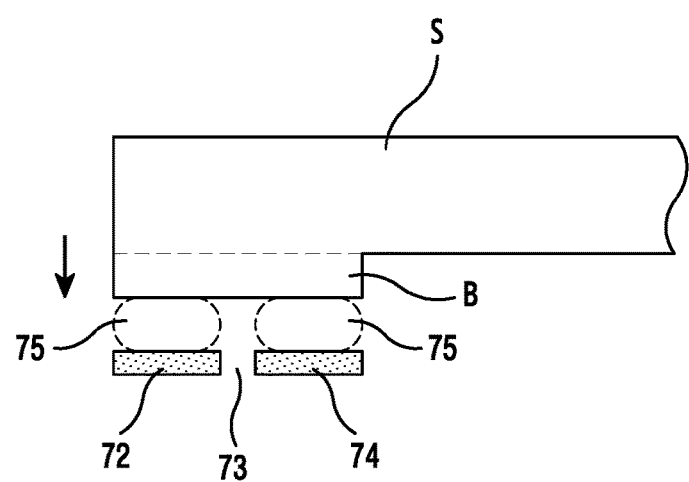
FIG. 33A illustrates a process of mounting a shield unit on a top surface pad formed on a PCB according to an embodiment of the present disclosure.

FIG. 33A illustrates a process of mounting a shield unit on a top surface pad formed on a PCB according to an embodiment of the present disclosure.

Referring to FIG. 33A, the shield unit S includes the leg portion B, which is connected with a plurality of top surface pads 72 and 74. That is, when the shield unit S is connected to a PCB in an SMD type, soldering regions 75 may be formed on the plurality of top surface pads 72 and 74, respectively, which are formed on the PCB, in order to connect the top surface pads 72 and 74 to the leg portion B.

A region 73, which is not provided with solder, may occur between the top surface pads 72 and 74, and thus, a predetermined amount of solder to be provided to the region 73, which is not provided with the solder, moves toward the top surface pads 72 and 74 so that the amount of solder to be provided to each of the top surface pads 72 and 74 may increase compared to the connecting structure illustrated in FIG. 32. Due to the increased amount of solder, the leg portion B of the shield unit S may be connected to each of the top surface pads 72 and 74 with an increased connecting amount of solder, i.e., an increased connecting height (thickness) of solder, which may prevent the poor connection that is caused by the floating phenomenon of the shield unit S as illustrated in FIG. 32.

As described above, in FIG. 33A, with the configuration in which the leg portion B (connecting portion) of the shield unit S, the amount of solder increases to increase the connecting thickness, thereby preventing the floating phenomenon of the shield.

Figure 33B:
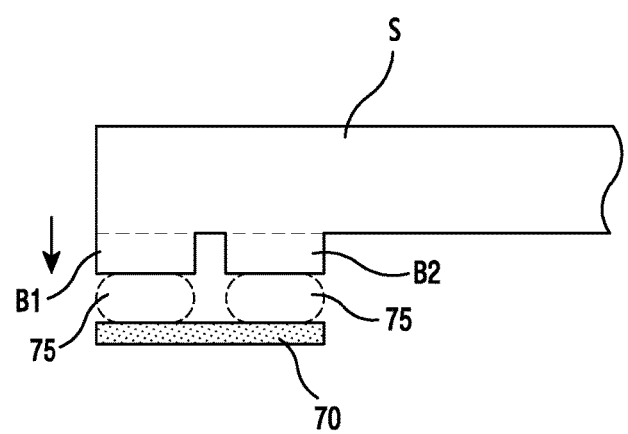
FIG. 33B illustrates a process of mounting a shield unit on a top surface pad formed on a PCB according to an embodiment of the present disclosure.

FIG. 33B illustrates a process of mounting a shield unit on a top surface pad formed on a PCB according to an embodiment of the present disclosure. Referring to FIG. 33B, a similar effect can be obtained when one top surface pad 70 is connected two leg portions B1 and B2 of the shield unit S. As compared to the soldering structure in which one leg portion and one top surface fad are connected to each other as illustrated in FIG. 32, the soldering structure in which two leg portions B1 and B2 and one top surface pad 70 are connected to each other is more effective in preventing the floating of the shield unit.

Figure 34:
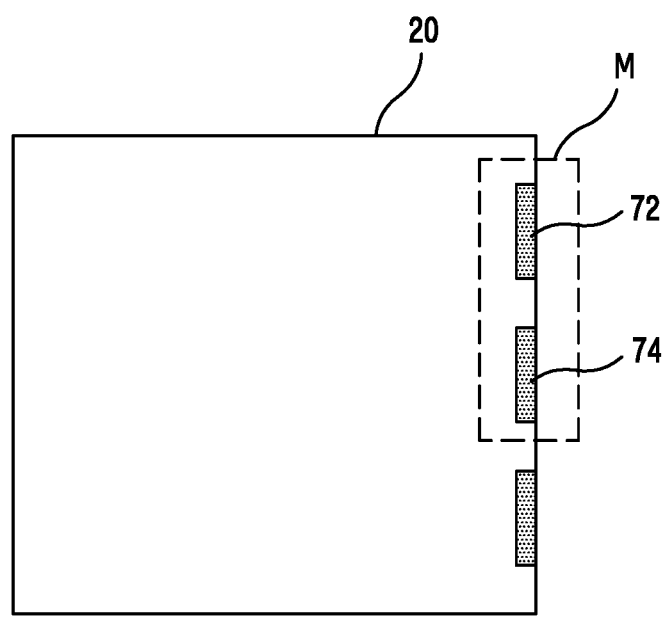
FIG. 34 illustrates top surface pads that are formed, using a metal mask, on a PCB, according to an embodiment of the present disclosure.

FIG. 34 illustrates top surface pads that are formed, using a metal mask, on a PCB, according to an embodiment of the present disclosure.

Referring to FIG. 34, a plurality of top surface pads 72 and 74 may be formed on the PCB 20 using a metal mask M in order to adjust an amount of solder. Thereafter, a leg portion of the shield unit may be connected to the plurality of top surface pads 72 and 74.

The side surface plating portion may be configured to be connected to each of the top surface pads 72 and 74 or not to be connected to each of the top surface pads 72 and 74.

Figure 35:
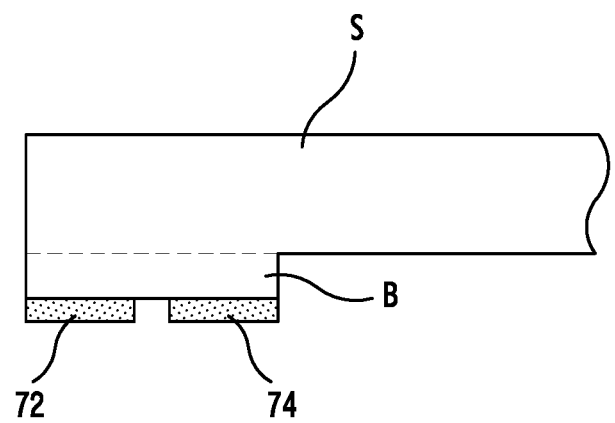
FIG. 35 illustrates a connecting state of a top surface pad, formed on a PCB and a shield unit according to an embodiment of the present disclosure.

FIG. 35 illustrates a connecting state of a top surface pad, formed on a PCB and a shield unit according to an embodiment of the present disclosure.

Referring to FIG. 35, a leg portion B of the shield unit S is connected to each of the plurality of top surface pads 72 and 74. Each of the top surface pads 72 and 74 can be connected to the side surface plating portion such that the top surface pads 72 and 74 can be connected with each other by the side surface plating portion. In addition, the top surface pads 72 and 74 can be connected to each other by the leg portion B.

Figure 36A:
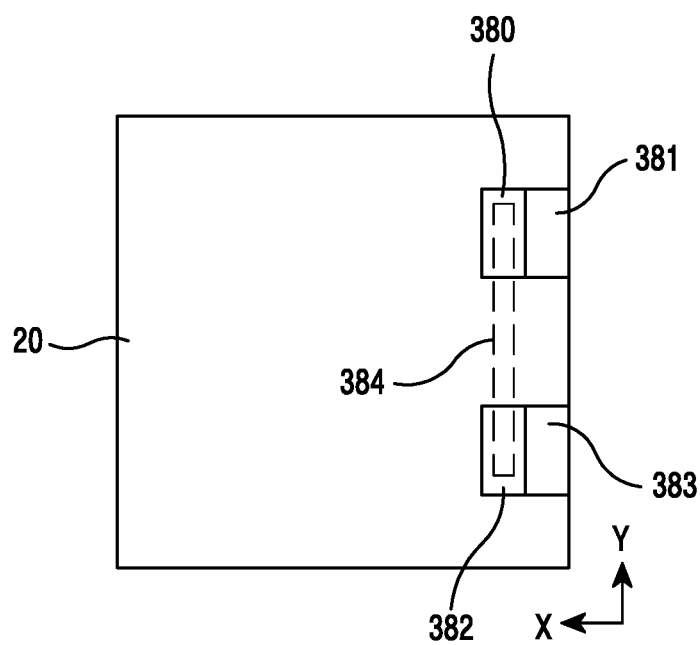
FIG. 36A illustrates a connecting region of a shield unit that is connected to a plurality of top surface pads formed along a first direction on a first surface of a PCB and a plurality of side surface plating portions, according to an embodiment of the present disclosure.

FIG. 36A illustrates a connecting region of a shield unit that is connected to a plurality of top surface pads formed along a first direction on a first surface of a PCB and a plurality of side surface plating portions, according to an embodiment of the present disclosure.

Referring to FIG. 36A, a plurality of top surface pads 380 and 382 are formed on the PCB 20 in a second direction (Y-axis direction). The first and second top surface pads 380 and 382, which are formed on the top surface of the PCB 20, may be formed to be connected to first and second side surface plating portions 381 and 383, respectively, which are formed on a side surface. A leg portion of the shield unit may then be connected to the first and second top surface pads 380 and 382.

Reference numeral 384 indicates a connecting region of the shield unit. A leg portion of the shield unit may interconnect the first and second top surface pads 380 and 382.

While FIG. 36A illustrates two top surface pads 380 and 382 as an example, the present disclosure is not limited thereto.

Figure 36B:
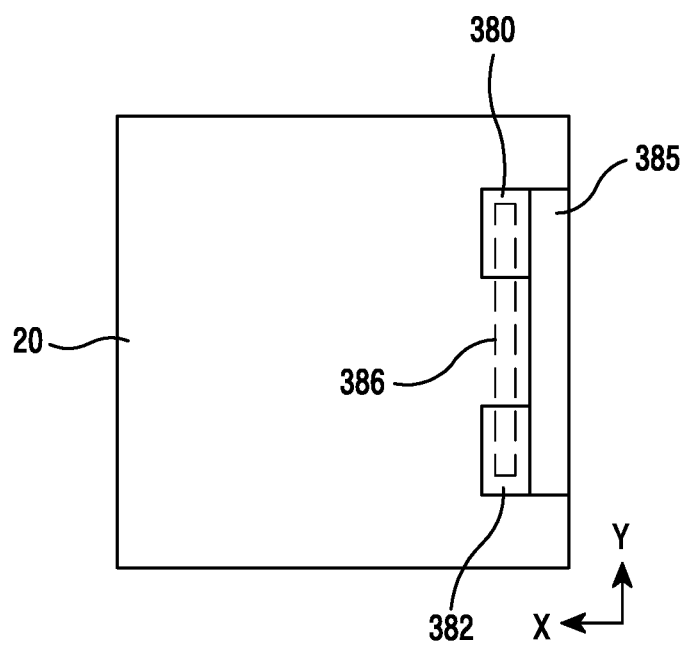
FIG. 36B illustrates a connecting region of a shield unit that is connected to a plurality of top surface pads formed along a second direction on a first surface of a PCB and a plurality of side surface plating portions, according to an embodiment of the present disclosure.

FIG. 36B illustrates a connecting region of a shield unit that is connected to a plurality of top surface pads formed along a second direction on a first surface of a PCB and a plurality of side surface plating portions, according to an embodiment of the present disclosure.

Referring to FIG. 36B, two top surface pads, i.e., first and second top surface pads 380 and 382, are formed on the PCB 20. Each of the first and second top surface pads 380 and 382, which are formed on the top surface of the PCB 20, may be connected to a single side surface plating portion 385, which is formed on a side surface of the PCB 20. A leg portion of the shield unit may be connected to the first and second top surface pads 380 and 382.

Reference numeral 386 refers to a connecting region of the shield unit. The leg portion of the shield unit may interconnect the first and second top surface pads 380 and 382.

Figure 36C:
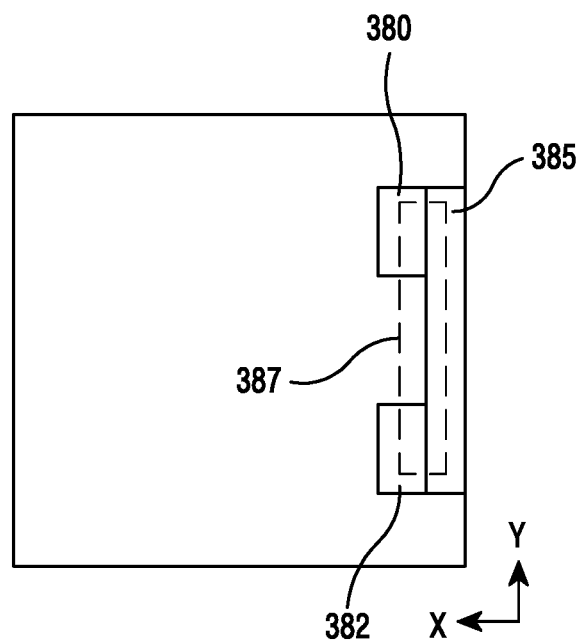
FIG. 36C illustrates a connecting region of a shield unit that is connected to a plurality of top surface pads formed along the second direction on a first surface of a PCB and a plurality of side surface plating portions, according to an embodiment of the present disclosure.

FIG. 36C illustrates a connecting region of a shield unit that is connected to a plurality of top surface pads formed along the second direction on a first surface of a PCB and a plurality of side surface plating portions, according to an embodiment of the present disclosure.

Referring to FIG. 36C, the leg portion 387 of the shield unit may be connected over top surface pads 380 and 382, and side surface plating portion 385.

Figure 37:
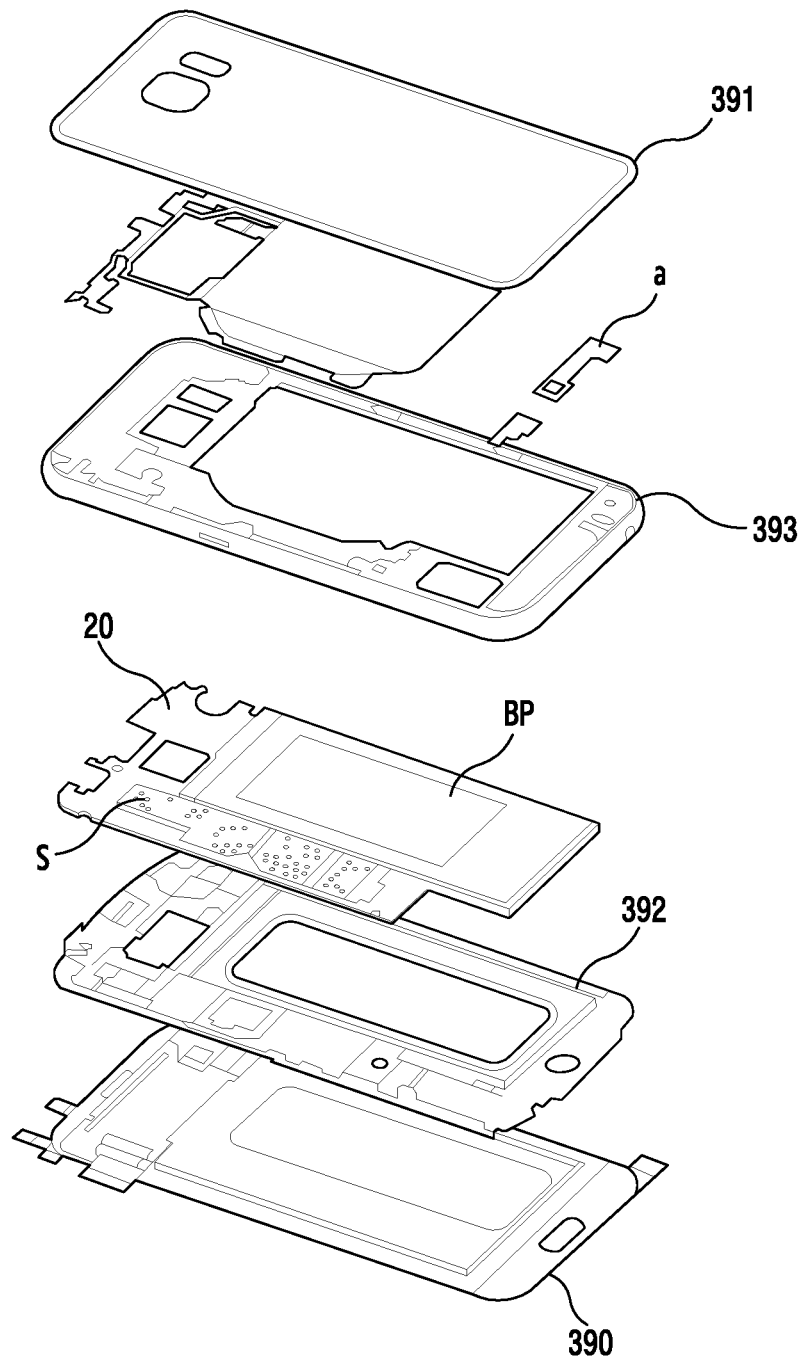
FIG. 37 illustrates an electronic device including a shield unit mounting structure according to an embodiment of the present disclosure.

FIG. 37 illustrates an electronic device including a shield unit mounting structure according to an embodiment of the present disclosure.

Figure 38:
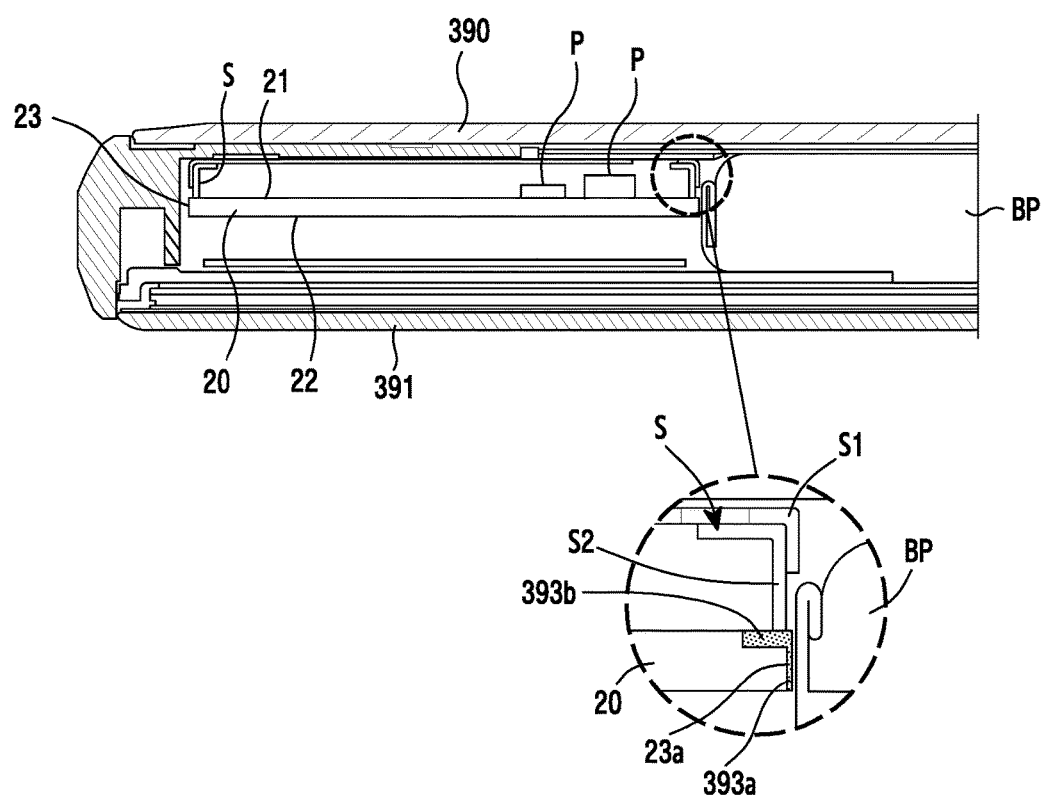
FIG. 38 illustrates an electronic device including a shield unit mounting structure in an assembled state according to an embodiment of the present disclosure.

FIG. 38 illustrates an electronic device including a shield unit mounting structure in an assembled state according to an embodiment of the present disclosure.

Referring to FIGS. 37 and 38, an electronic device includes first and second covers 390 and 391 that form a portion of the exterior of the electronic device. The first cover 390 forms a first face (e.g., the front face), and the second cover 391 forms a second face (e.g., the rear face). Accordingly, the first cover 390 may be referred to as a front cover, and the second cover 391 may be referred to as a rear cover. The second face may form a surface that is opposite to the first face, and the second cover 391 may be placed to be opposite to the first cover 390. The first cover 390 may include at least one of a metal, glass, and a polymer material. The second cover 391 may include glass.

Between the first and second covers 390 and 391, the PCB 20 may be arranged and a plurality of various electronic components may be mounted on the PCB 20. The PCB 20 may be supported by an internal support structure 392. The PCB 20 includes the top surface 21 that faces the first cover 390, the bottom surface 22 that faces the second cover 391, and the side surface 23. On the top surface 21 and/or the bottom surface 22 of the PCB 20, one or more various electronic components may be arranged to be close to a portion of the side surface 23. Some of the electronic components mounted on the PCB 20 may be covered by the shield structure S. In addition, at least a portion of the side surface 23 of the PCB 20 may be provided with a recess 23a, in which a first conductive structure 393a may be at least partially or entirely positioned.

The shield structure S may be the same as or similar to the shield unit that has been previously described. The shield structure S includes a cap S1 arranged between the first cover 390 and the first surface 21, and one or more sidewalls S2 that extend from the periphery of the cap S1 toward the first surface 21. The electronic components are enclosed by the cap s1 and the sidewalls S2 that are bent and extend downward from the periphery of the cap S1. The shield structure S may include a conductive material. For example, the shield structure S may be made of a metallic material.

The first conductive structure 393a may be formed on a portion of the side surface 23. The first conductive structure 393a may be the side surface plating portion.

At least one second conductive structure 393b may be formed on at least a portion of the top surface 21 of the PCB 20. The second conductive structure 393b may be formed to be connected to the first conductive structure 393a, and to have a surface that faces the first cover. The first conductive structure 393a and the second conductive structure 393b may form respective layers in different thicknesses. The first conductive structure 393a may have a first thickness, and the second conductive structure 393b may have a second thickness. The first thickness may be smaller than the second thickness. The first thickness may be about 50 µm, and the second thickness may be about 400 µm.

The second conductive structure 393b may be formed in various shapes. For example, the second conductive structure 393b may be formed in a linear shape or a "T" shape. In addition, the second conductive structure 393b may extend in the second direction from a portion of the side surface 23 of the PCB 20, and the width of the second conductive structure 393b in the second direction may be larger than the second thickness.

The first conductive structure 393a may be formed to be connected to the second conductive structure 393b, and to extend from an edge of the top surface 21 of the PCB 20 to an edge of the second surface.

The sidewall S2 of the shield structure S may include a portion that extends in a first direction that is not parallel to the surface and is contacted with the surface. The contacted portion may be formed on one or more side surfaces 23. In addition, the contacted portion may be arranged to overlap with the second conductive structure 393b when viewed from a location above the top surface 21 of the PCB 20. In addition, the contacted portion may be arranged to be aligned with a portion of the side surface 23 of the PCB 20 when viewed from a location above the top surface 21 of the PCB 20. The side surface 23 may be perpendicular to the first direction.

Figure 39:
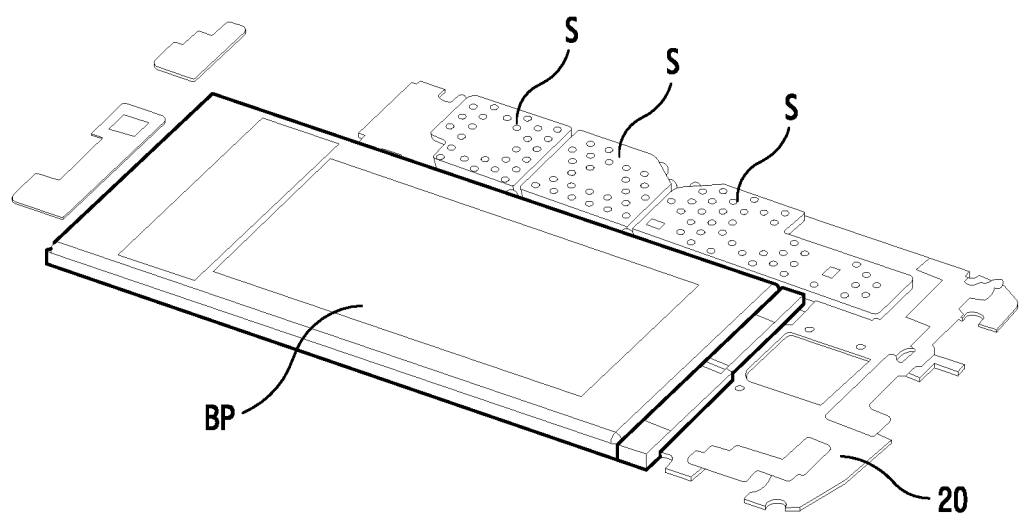
FIG. 39 illustrates a mounting state of a shield structure and a battery pack, which are mounted on a PCB, according to an embodiment of the present disclosure.

FIG. 39 illustrates a mounting state of a shield structure and a battery pack, which are mounted on a PCB, according to an embodiment of the present disclosure.

Figure 40:
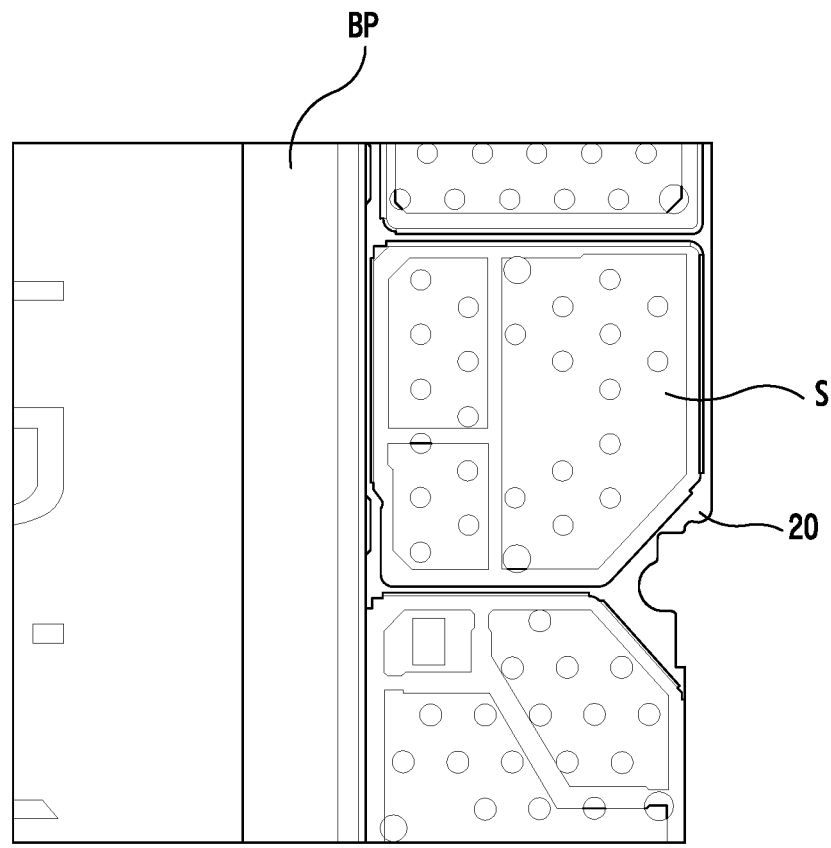
FIG. 40 illustrates a mounting state of a shield structure and a battery pack, which are mounted on a PCB, according to an embodiment of the present disclosure.

FIG. 40 illustrates a mounting state of a shield structure and a battery pack, which are mounted on a PCB, according to an embodiment of the present disclosure.

Referring to FIGS. 39 and 40, at least a portion of the shield structure S may be arranged adjacent to a battery pack BP. In addition, at least a portion of the side surface of the PCB 20 may be arranged adjacent to the battery pack BP. In addition, the first conductive structure may be arranged adjacent to the battery pack BP, and more specifically, between the side surface and the battery pack BP. The battery pack BP may be arranged in parallel to the shield structure S without overlapping with the shield structure S.

As illustrated in FIG. 39, multiple shield structures S are arranged around the battery pack BP.

Figure 41:
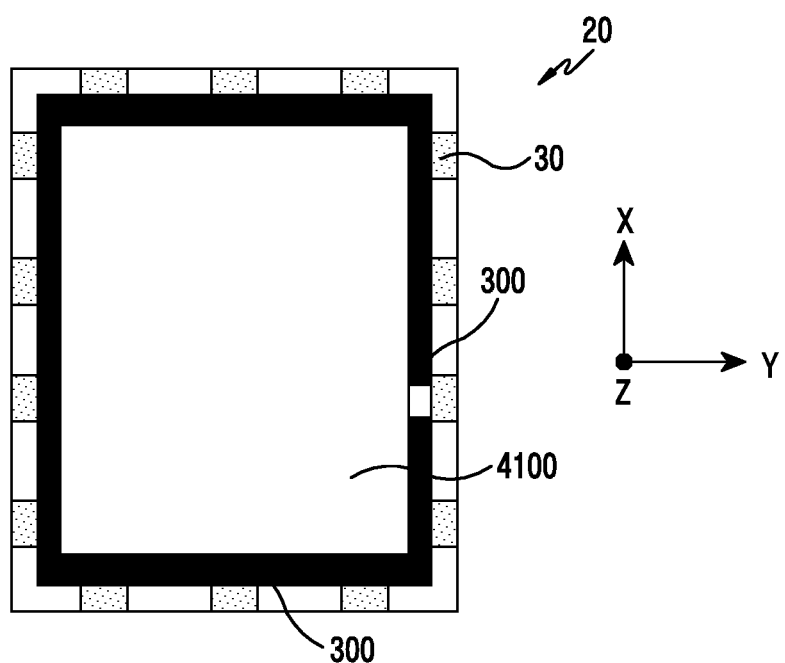
FIG. 41 illustrates a PCB according to an embodiment of the present disclosure.

FIG. 41 illustrates a PCB according to an embodiment of the present disclosure.

Referring to FIG. 41, a plurality of top surface pads 30 are provided on the PCB 20.

When the top surface pads 30 are electrically connected to the PCB 20, the top surface pads 30 may be directly connected to the GND of the PCB 20, or may be connected with a specific signal through one or more electromagnetic components of a coupling. However, the top surface pads 30 may be electrically connected to each other through the shield unit. When the top surface pads 30 are directly connected to the GND of the PCB 20, the GND may extend to lower direct current resistance (DCR) of the GND such that a signal level can be stabilized and a heat diffusion degree can be improved.

However, when the top surface pads 30 are connected to the PCB 20 through an electromagnetic component (e.g., a capacitor 300) or a coupling, it is possible to block DC and to transmit AC to the shield unit while restricting some frequency values of the AC. When the shield unit is connected to an external metal region, the amount of AC transmitted from the inside of the PCB can be reduced so that electric shock can be prevented. In addition, when the shield unit is prevented from being connected to the external metal region through an insulating tape in order to prevent electric shock, a space for the insulating tape is needed. However, when the DC and a part of the AC are restricted by an electric component, it is possible to reduce the space for the insulating tape so that the thickness of the electronic device (e.g., a terminal) can be reduced.

In addition, when the top surface pads 30 are connected to the PCB 20 through an electromagnetic (e.g., inductor), the same effect can also be obtained by restricting some frequency values of AC.

Reference numeral 4100 indicates a space on which components are mounted in the PCB.

According to various embodiments of the present disclosure, a side surface plating portion is extended in a PCB to be used as a shield connecting pad. Compared to when a shield is mounted on a side surface in an SMD type, according to various embodiments of the present disclosure, it is not necessary to reduce the PCB region, which is advantageous in terms of the wiring arrangement. In addition, compared to when a shield is mounted on an upper or lower end of the PCB in an SMD type, according to various embodiments of the present disclosure, a design for preventing EMI/ESD is not needed so that a wiring space can be used as much as possible.

While the present disclosure has been particularly shown and described with reference to certain embodiments thereof, it will be understood by those of ordinary skill in the art that various changes in form and details may be made therein without departing from the spirit and scope of the present disclosure as defined by the following claims and their equivalents.

What is claimed is:

1. A portable communication device comprising:
    a housing forming at least one portion of an outer surface of the portable communication device;
    a printed circuit board (PCB) at least partially accommodated by the housing, the PCB including a first surface, a second surface opposite to the first surface, and a side surface connecting the first surface and the second surface;

a conductive structure formed adjacent to an ending portion of the PCB, a first surface of the conductive structure being exposed in a first direction corresponding to the first surface of the PCB and a second surface of the conductive structure being substantially perpendicular to the first surface of the conductive structure and exposed in a second direction corresponding to the side surface of the PCB; and a conductive metal in contact with the first surface of the conductive structure.

2. The portable communication device of claim 1, wherein the conductive structure includes a first conductive substructure and a second conductive substructure, the first surface of the conductive structure forming at least one portion of the first conductive substructure and the second surface of the conductive structure forming at least one portion of the second conductive substructure.

3. The portable communication device of claim 2, further comprising:
another conductive structure including a third conductive substructure and a fourth conductive substructure,
wherein the third conductive substructure is spaced apart from and parallel to the first conductive substructure, and the fourth conductive substructure is spaced apart from and parallel to the second conductive substructure.

4. The portable communication device of claim 1, wherein the first surface of the conductive structure is in contact with a ground portion of the portable communication device.

5. The portable communication device of claim 1, further comprising:
another conductive structure formed adjacent to the ending portion of the PCB, a surface of the other conductive structure being exposed in a third direction corresponding to the second surface of the PCB.

6. The portable communication device of claim 5, wherein the other conductive structure is spaced apart from the conductive structure.

7. The portable communication device of claim 5, wherein the other conductive structure is in contact with the second surface of the conductive structure.

8. The portable communication device of claim 1, further comprising:
a shield structure formed over the PCB, the conductive structure and the conductive metal, one ending portion of the conductive metal being in contact with the shield structure.

9. The portable communication device of claim 8, wherein the shield structure includes a first shield substructure and a second shield substructure, the first shield substructure being substantially parallel to the first surface of the PCB, and the second shield substructure extending from and being substantially perpendicular to the first shield substructure.

10. A portable communication device comprising:
a housing forming at least one portion of an outer surface of the portable communication device;
a printed circuit board (PCB) at least partially accommodated by the housing, the PCB including a first surface, a second surface opposite to the first surface, and a side surface connecting the first surface and the second surface;
one or more electrical components attached on the first surface of the PCB;
a conductive structure formed adjacent to an ending portion of the PCB, a first surface of the conductive structure being exposed in a first direction corresponding to the first surface of the PCB and a second surface of the conductive structure being substantially perpendicular to the first surface of the conductive structure and exposed in a second direction corresponding to the side surface of the PCB; and a shield structure formed over at least one electrical component of the one or more electrical components, an ending portion of the shield structure being in contact with the first surface of the conductive structure.

11. The portable communication device of claim 10, wherein the conductive structure includes a first conductive substructure and a second conductive substructure, the first surface of the conductive structure forming at least one portion of the first conductive substructure and the second surface of the conductive structure forming at least one portion of the second conductive substructure.

12. The portable communication device of claim 10, wherein the first surface of the conductive structure is in contact with a ground portion of the portable communication device.

13. The portable communication device of claim 10, further comprising:
another conductive structure formed adjacent to the ending portion of the PCB, a surface of the other conductive structure being exposed in a third direction corresponding to the second surface of the PCB.

14. The portable communication device of claim 10, wherein the shield structure includes a first shield substructure and a second shield substructure, the first shield substructure being substantially parallel to the first surface of the PCB, and the second shield substructure extending from and being substantially perpendicular to the first shield substructure.

15. A portable communication device comprising:
a housing forming at least one portion of an outer surface of the portable communication device;
a printed circuit board (PCB) at least partially accommodated by the housing, the PCB including a first surface, a second surface opposite to the first surface, and a side surface connecting the first surface and the second surface;
a first conductive structure formed adjacent to an ending portion of the PCB, a first surface of the first conductive structure being exposed in a first direction corresponding to the first surface of the PCB and a second surface of the first conductive structure being substantially perpendicular to the first surface of the conductive structure and exposed in a second direction corresponding to the side surface of the PCB; and
a second conductive structure formed adjacent to the ending portion of the PCB, a surface of the second conductive structure exposed in a third direction corresponding to the second surface of the PCB.

16. The portable communication device of claim 15, wherein the second conductive structure is spaced apart from the second surface of the conductive structure.

17. The portable communication device of claim 15, wherein the second conductive structure is in contact with the second surface of the conductive structure.

18. The portable communication device of claim 15, wherein a portion of the first surface of the first conductive structure connects with a ground portion of the portable communication device.

19. The portable communication device of claim 15, further comprising:

a shield structure formed over the first surface of the PCB, an ending portion of the shield structure being in contact with the first surface of the first conductive structure.

20. The portable communication device of claim 19, further comprising:
another shield structure formed over the second surface of the PCB, an ending portion of the other shield structure being in contact with the second conductive structure.

* * * * *